(12) United States Patent
Takayama et al.

(10) Patent No.: US 8,587,035 B2
(45) Date of Patent: Nov. 19, 2013

(54) DEVICE

(75) Inventors: Shinichi Takayama, Tokyo (JP);
Yasutoshi Yamada, Fukuoka (JP)

(73) Assignee: Elpida Memory, Inc., Tokyo (JP)

( * ) Notice: Subject to any disclaimer, the term of this patent is extended or adjusted under 35 U.S.C. 154(b) by 102 days.

(21) Appl. No.: 13/042,108

(22) Filed: Mar. 7, 2011

(65) Prior Publication Data

US 2011/0220968 A1 Sep. 15, 2011

(30) Foreign Application Priority Data

Mar. 11, 2010 (JP) ................................ 2010-054338

(51) Int. Cl.
*H01L 23/52* (2006.01)

(52) U.S. Cl.
USPC .................................. 257/208; 257/E23.151

(58) Field of Classification Search
USPC .......................................... 257/208, E23.151
See application file for complete search history.

(56) References Cited

U.S. PATENT DOCUMENTS

| 7,259,977 | B2 | 8/2007 | Takeyama et al. |
| 2005/0162885 | A1* | 7/2005 | Kanamitsu et al. ............. 365/63 |
| 2006/0160305 | A1* | 7/2006 | Mokhlesi et al. ............. 438/257 |
| 2009/0191677 | A1* | 7/2009 | Forbes .......................... 438/268 |
| 2009/0273961 | A1 | 11/2009 | Ono et al. |
| 2009/0296473 | A1* | 12/2009 | Meyer ...................... 365/185.13 |
| 2010/0090267 | A1* | 4/2010 | Jeong et al. .................... 257/324 |

FOREIGN PATENT DOCUMENTS

| JP | 2004-158519 A | 6/2004 |
| JP | 2006-032577 A | 2/2006 |
| JP | 2009-271985 A | 11/2009 |

* cited by examiner

*Primary Examiner* — Vongsavanh Sengdara
(74) *Attorney, Agent, or Firm* — Sughrue Mion, PLLC

(57) ABSTRACT

A device includes a semiconductor substrate, a first local bit line formed in the semiconductor substrate and elongated in a first direction, a first insulating layer on the semiconductor substrate, a first global bit line formed on the first insulating layer, a first path formed in the first insulating layer to couple a first end of the first local bit line with the first global bit line, and a second path formed in the first insulating layer to couple a second end of the first local bit line with the first global bit line.

23 Claims, 20 Drawing Sheets

DEVICE

This application is based upon and claims the benefit of priority from Japanese patent application No. 2010-54338, filed on Mar. 11, 2010, the disclosure of which is incorporated herein in its entirety by reference.

BACKGROUND OF THE INVENTION

This invention relates to a device, and particularly to a semiconductor device having a hierarchical bit line structure.

A semiconductor device in which bit lines are hierarchized has been proposed in order to ensure compatibility between high integration and high speed. Such a semiconductor device is disclosed in Japanese Laid-Open Patent Publication No. 2004-158519 (Patent Document 1).

Furthermore, there is known a semiconductor memory device in which a local bit line is connected to a global bit lines at both ends thereof via NMOS (n-channel metal oxide semiconductor) and PMOS (p-channel metal oxide semiconductor) transistors. Such a semiconductor device is disclosed in Japanese Laid-Open Patent Publication No. 2006-32577 (Patent Document 2).

Still furthermore, there is known a semiconductor device in which bit line selection switches are provided at both ends of a hierarchical local bit line to increase rewriting current for a resistance change type memory by connecting the local bit line with a global bit line. Such a semiconductor device is disclosed in Japanese Laid-Open Patent Publication No. 2009-271985 (Patent Document 3).

SUMMARY

Though the semiconductor device disclosed in Patent Document 1 aims to ensure compatibility between high integration and high speed, there is a demand for a technique that ensures compatibility between higher integration and higher speed.

The semiconductor memory device disclosed in Patent Document 2 has two transistors of different conductive types which are connected to both ends of the local bit line. Accordingly, it is necessary to form a well region (or conduct well isolation) in an area for one conductive type transistor (e.g. a p-channel metal oxide semiconductor transistor). As a result, the semiconductor memory device has a problem that a layout area thereof is large.

In the semiconductor device disclosed in Patent Document 3, a plurality of local bit lines are included in one sub-memory array. The semiconductor device has a plurality of pairs of selection switches connected to both ends of the local bit lines to allow selecting one of the local bit lines. The semiconductor device further has a plurality of control lines to individually control the pairs of selection switches. The control lines must be located in a state that they are isolated from one another. Accordingly, the semiconductor device has a problem that a layout area thereof is large.

The present invention seeks for providing a device which can solve one or more problems mentioned above.

In one embodiment, there is provided a device that includes a semiconductor substrate, a first local bit line formed in the semiconductor substrate and elongated in a first direction, a first insulating layer formed on the semiconductor substrate, a first global bit line formed on the first insulating layer, a first path formed in the first insulating layer to couple a first end of the first local bit line with the first global bit line, and a second path formed in the first insulating layer to couple a second end of the first local bit line with the first global bit line.

In another embodiment, there is provided a device that includes a first global bit line elongated in a first direction, a second global bit line arranged in a second direction intersecting with the first direction with respect to the first global bit line without any other global bit line therebetween and elongated in the first direction to be substantially parallel with the first global bit line, a first local bit line elongated in the first direction, a second local bit line arranged in the second direction with respect to the first local bit line without any other local bit line therebetween and elongated in the first direction to be substantially parallel with the first local bit line, a first transistor connected between one end of the first local bit line and the first global bit line and having a first conductivity type to be controlled with a first control signal, a second transistor connected between one end of the second local bit line and the second global bit line and having the first conductivity type to be controlled with the first control signal, a third transistor connected between the other end of the first local bit line and the first global bit line and having the first conductivity type to be controlled with a second control signal, and a fourth transistor connected between the other end of the second local bit line and the second global bit line and having the first conductivity type to be controlled with the second control signal.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
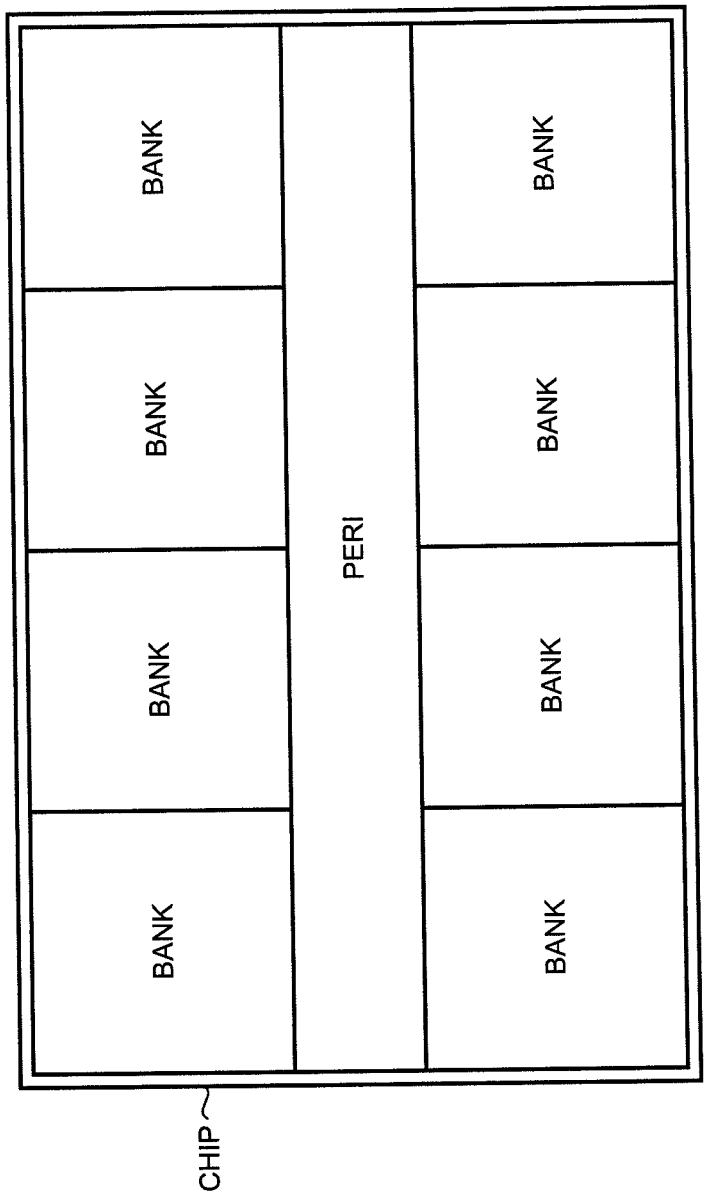
FIG. 1 is a schematic diagram of a semiconductor device according to a first embodiment of this invention.

This invention seeks to provide a semiconductor device having a hierarchical bit line structure that allows speeding up of writing operation and suppressing increase of layout area.

The invention has one feature that, in a hierarchical bit line structure, switch metal oxide semiconductor (MOS) transistors, which couple a global bit line with a local bit line, are connected to both ends of the local bit line. Due to such a feature of the invention, a writing speed can be increased. It is forecast that resistance of a bit line is increased by prospective feature size reduction. In the circumstances, the feature of the invention is effective measures for increasing the writing speed.

Generally, in a memory cell array in which vertical MOS transistors of which channels are formed in a vertical direction are employed, if a switch MOS transistor is connected to one of the ends of a local bit line, local bit lines connected to switch MOS transistors at left sides and local bit lines connected to switch MOS transistors at right sides are alternately arranged. In such a case, the switch MOS transistors and dummy MOS transistors are alternately arranged in a word line direction. The invention diverts the dummy MOS transistors to switch MOS transistors. Consequently, both ends of local bit lines can be coupled with global bit lines without (or with suppressing) increase of a layout area.

Furthermore, in a device to which the invention is applied, it is possible to increase the number of memory cells that are connected to a local bit line and to reduce the number of rows of switch MOS transistors. Accordingly, it is possible to reduce a layout area of the device.

In particular, the invention relates to a hierarchical bit line structure including a global bit line and a local bit line to which memory cells are connected. The structure has one feature that a sense amplifier is connected to the global bit line and that switch MOS transistors to couple the local bit line with the global bit line are connected to both ends of the local bit line.

According to the structure, when writing operation is performed, the switch MOS transistors connected to the both ends of the local bit line are turned on and thereby the both ends of the local bit line are electrically connected to the global bit line. As a result, it is possible to drive a load of the local bit line from the both ends thereof.

Here, it is assumed that a switch MOS transistor is connected to one of ends of a local bit line to which a plurality of memory cells are connected. In such a case, the memory cell that is nearest to the other end of the local bit line among the memory cells has the slowest writing speed. In this case, it is assumed that a resistance from the switch MOS transistor to the other end of the local bit line is represented by R1.

In contrast, according to the invention, switch MOS transistors are connected to both ends of a local bit line. Accordingly, the memory cell that is located nearby the middle of the local bit line has the slowest writing speed. In this case, a resistance from one of the switch MOS transistors to the memory cell located nearby the middle of the local bit line is equal to R1/2. In addition, the local bit line can be driven from the both ends thereof. Accordingly, a combined resistance R2 from the switch MOS transistors to the memory cell located nearby the middle of the local line is equal to $(R1/2)/2=R1/4$. Thus, in comparison with the case where a switch MOS transistor is connected either end of a local bit line, the resistance component to the memory cell having the slowest writing speed can be reduced to a fourth ($=1/4$). As a result, it is possible to increase the writing speed.

The invention is particularly effective in the structure in which a resistance load of a local bit line is a dominant factor to decide a writing time. In particular, in a buried bit line configuration in which a vertical MOS transistor is employed in a memory cell and a local bit line has small capacitance and large resistance, the writing speed can be increased.

In the structure in which a local bit line has small capacitance and large resistance, even if the local bit line has a double length which allows the number of memory cells connected to the local bit line to be doubled, the writing operation can be increased in comparison with the structure in which a switch MOS transistor is connected to either end of a local bit line. If the local bit line has the double length, the number of switch MOS transistors is reduced by half. Accordingly, area for arranging the switch MOS transistors can be reduced by half and thereby an layout area can be reduced.

In a case where a layout according to the invention is adapted to a $4F^2$ cell configuration in which a vertical MOS transistor of the same type as that of the memory cell is employed as a switch MOS transistor, contacts (TH1s), which couple switch MOS transistors, global bit lines and M1 wirings that are lower wirings of the global bit lines with one another, are arranged in stagger.

With the layout according to the invention, intervals between contacts (TH1-TH1) are secured while increase of a layout area for switch MOS transistors is suppressed to the minimum.

In addition to the configuration in which switch MOS transistors are connected to both ends of a local bit line, similarly, pre-charge MOS transistors may be connected to the local bit line. Hereby pre-charge operation speed can be increased without increase of the layout area.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the drawings, the same reference numbers are used for the same elements as a rule. Repetition of the explanation will be evaded.

In the following embodiments, the numbers (including the numbers, values, quantities, ranges or the like) of components are merely examples. The numbers of the components are not limited to the exemplified numbers except for a case where the numbers are clearly specified or a case where the numbers are limited in theory. The numbers of components may be larger or smaller than the exemplified numbers.

Furthermore, in the following embodiments, each of the components (including steps) is not indispensable except for a clearly specified case or a case where the component is clearly indispensable in theory. Similarly, shape or positional relationship of the components are merely examples. Various shapes similar to exemplified shape are included in the invention except for a clearly specified case or a case where the shape is eliminated in theory. This is true of the values or the ranges mentioned above.

In addition, the term of "end" includes the end and periphery thereof.

Still furthermore, in the following embodiments, though MOS transistors are exemplified as transistors, other transistors which are different from the MOS transistors in structure may be employed. Though the exemplified MOS transistors are N-channel (first conductive type) MOS transistors, they may be replaced with P-channel (second conductive type) MOS transistors.

FIG. 1 is a schematic diagram of a semiconductor device (or a dynamic random access memory (DRAM) chip, hereinafter referred to simply as a "chip CHIP") according to a first embodiment of this invention.

The chip CHIP, as illustrated in FIG. 1, includes a control circuit and input-output circuit PERI and a plurality of memory banks BANKs. The control circuit and input-output circuit PERI includes a control circuit. The control circuit receives input of clock, address and control signals from outside of the chip and decides an operation mode of the chip and pre-decodes address. Furthermore, the control circuit and input-output circuit PERI includes an input and output circuit. The input and output circuit has input and output buffers, receives input of writing data from the outside of the chip, and outputs reading out data to the outside of the chip.

Figure 2:
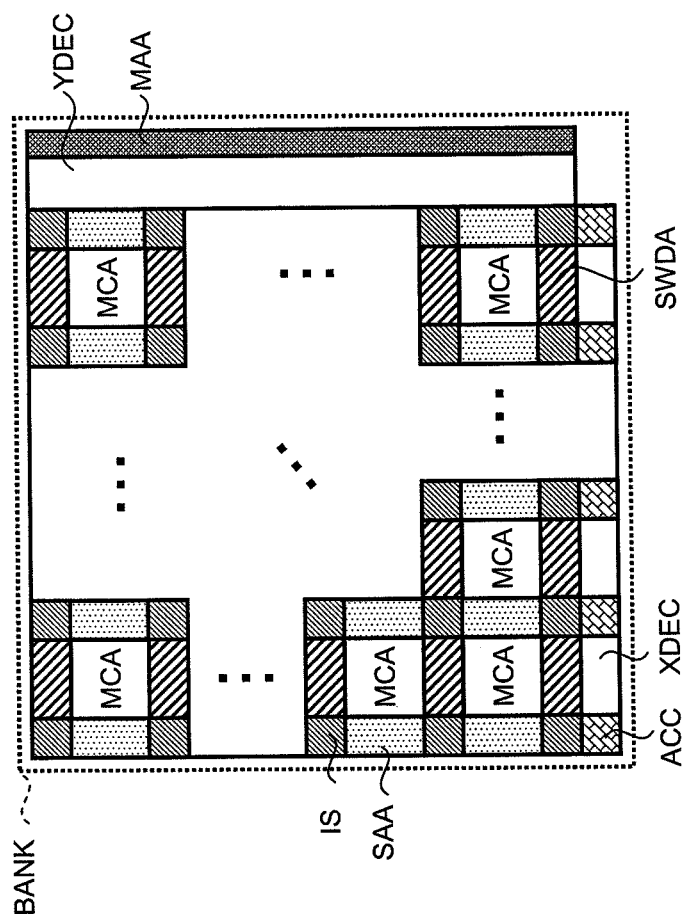
FIG. 2 is a schematic diagram of a memory bank (BANK) included in the semiconductor device (CHIP) illustrated in FIG. 1.

FIG. 2 is a schematic diagram of the memory bank BANK included in the chip CHIP of FIG. 1. As shown in FIG. 2, a plurality of memory cell arrays MCAs are arranged in vertical and horizontal directions. In a periphery of each memory cell array MCA, sub-word driver arrays SWDAs, sense amplifier arrays SAAs and cross areas ISs are located. At an outer side of the memory bank BANK, a Y (or column) decoder YDEC and a main amplifier array MAA are located in parallel with the sense amplifier array SAAs while X (or row) decoders XDECs and array control circuits ACCs are located in parallel with the sub-word drivers SWDAs.

Figure 3:
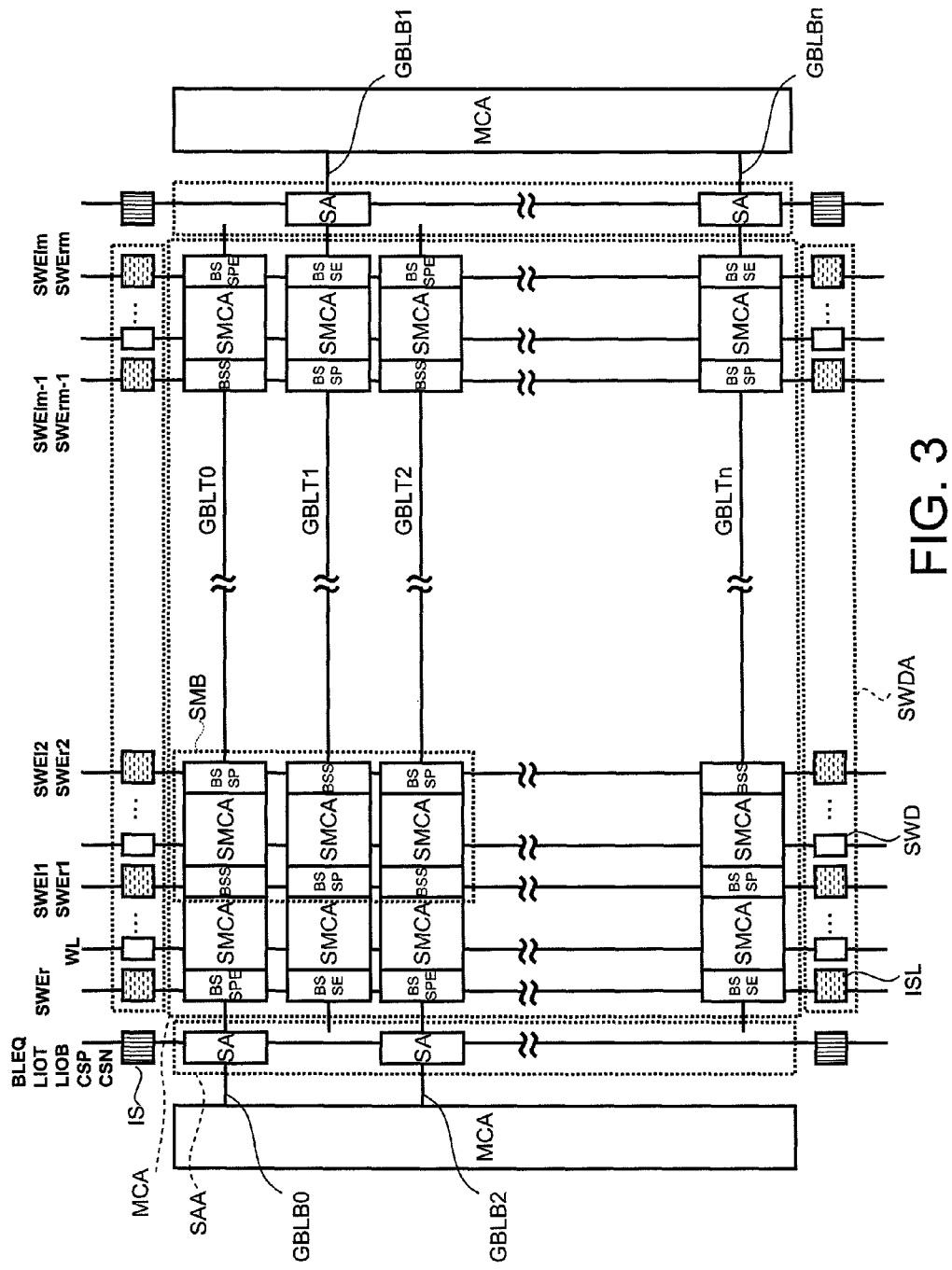
FIG. 3 is a configuration diagram of a memory cell array (MCA) and peripheral circuits thereof included in the memory bank (BANK) illustrated in FIG. 2.

FIG. 3 shows a configuration of the memory cell array MCA and its peripheral circuits which are included in the memory bank BANK of FIG. 2. The sense amplifier arrays SAAs, each of which includes a plurality of sense amplifiers SAs, are adjacently located at both sides (or right and left sides in FIG. 3) of the memory cell arrays MCA with respect to a first direction. The sub-word driver arrays SWDAs, each of which includes a plurality of sub-word driver SWDs and a plurality of control circuits ISLs for bit line connection switch arrays, are adjacently located at both sides (or upper and lower sides in FIG. 3) of the memory cell arrays MCA with respect to a second direction which intersects with the first direction. Each of the sense amplifier arrays SAAs is shared by the memory cell arrays MCAs located at both sides thereof with respect to the first direction. Each of the sub-word driver arrays SWDAs is shared by memory cell arrays MCAs located at both sides thereof with respect to the second direction.

The memory cell array MCA includes a plurality of global bit lines GBLs (T0-Tn), four kinds of bit line connection switch arrays BSSEs, BSSPEs, BSSs and BSSPs, a plurality of ward lines WLs, and sub-memory cell arrays SMCAs.

Each of the bit line connection switch arrays BSSEs, BSSPEs, BSSs and BSSPs includes at least one switch metal oxide semiconductor (MOS) transistor which is controlled with a control signal SWE (r, r1-rm, l1-lm) to connect the global bit line GBL to a local bit line provided in the corresponding sub-memory cell array SMCA.

Each of the bit line connection switch arrays BSSEs and BSSPEs is located at an end of the memory cell array MCA. The bit line connection switch array BSSE has the switch MOS transistor and no pre-charge MOS transistor while the bit line connection switch array BSSPE has the switch MOS transistor and pre-charge MOS transistor.

Each of the bit line connection switch arrays BSSs and BSSPs is located between two adjacent sub-memory cell arrays SMCAs. The bit line connection switch array BSS has the switch MOS transistor and no pre-charge MOS transistor while the bit line connection switch array BSSP has the switch MOS transistor and pre-charge MOS transistor.

A sub-memory block SMB consists of three (3×1 matrix) sub-memory cell arrays SMCAs and bit line connection switch arrays located on both sides thereof with regard to the first direction.

Figure 4:
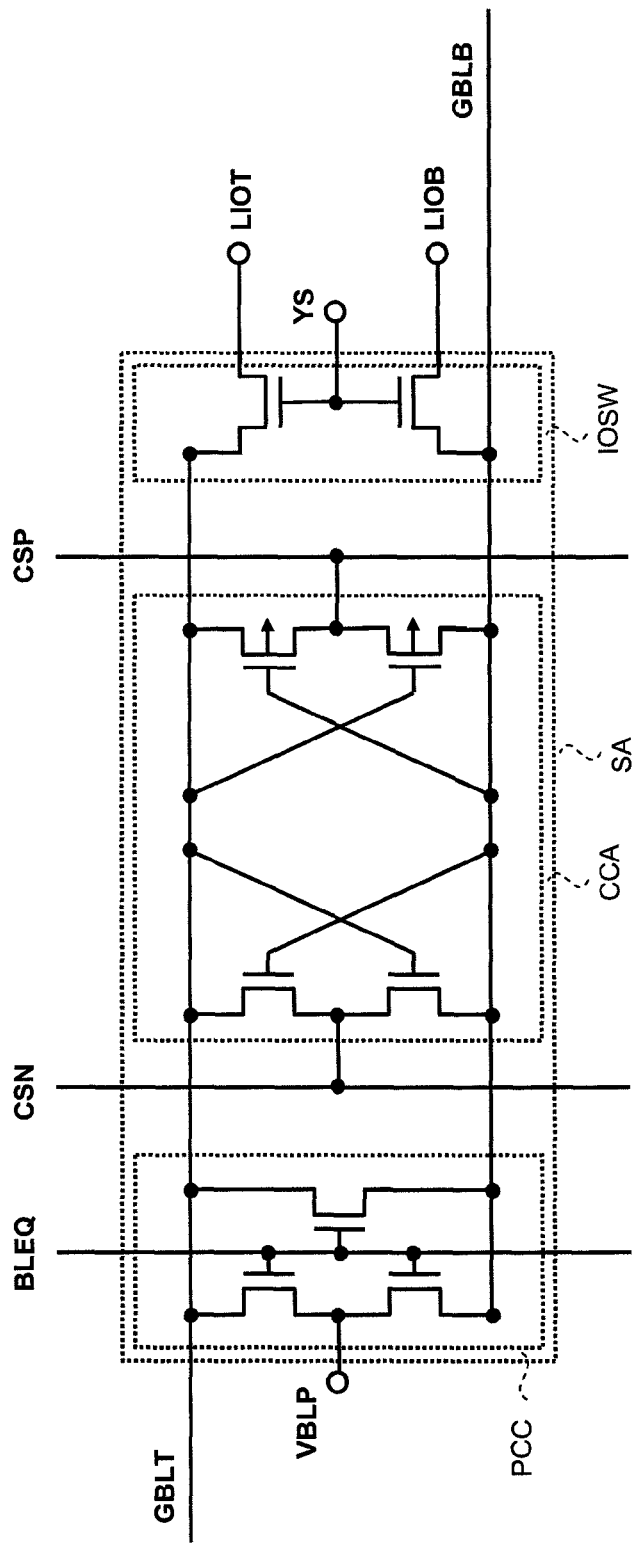
FIG. 4 is a configuration diagram of a sense amplifier (SA) included in a sense amplifier array (SAA)

FIG. 4 shows a configuration of the sense amplifier SA included in the sense amplifier array SAA. The sense amplifier SA includes a pre-charge circuit PCC, an input-output (IO) connection circuit IOSW, and a cross coupling amplifier circuit CCA.

The pre-charge circuit PCC includes three MOS transistors and is controlled by means of a bit line equalization signal BLEQ. In a standby state, the bit line equalization signal BLEQ is at a logical high level and the MOS transistors are in a conductive state. Hence the global bit line GBLT and an inverted global bit line GBLB are jointly pre-charged at a pre-charged electric potential VBLP. Both of the global bit line GBLT and the inverted global bit line GBLB are referred to as the global bit line GBLs.

The IO connection circuit IOSW includes two MOS transistors and is controlled by means of a column selection switch signal (YS). During reading, the column selection switch signal YS is at a logical high level and the MOS transistor are in a conductive state. Consequently, data read out from a memory cell are transmitted to local IO line LIOT and inverted local IO line LIOB. During writing, the column selection switch signal YS is at the logical high level and the MOS transistor is in the conductive state. Hence, writing data are transmitted from the local IO line LIOT and the inverted local IO line LIOB to the global bit line GBLT and the inverted global bit line GBLB.

The cross coupling amplifier circuit CCA includes two n-channel MOS (NMOS) transistors and two p-channel MOS (PMOS) transistors. Sources of the NMOS transistors are connected to an NMOS common source line CSN while sources of the PMOS transistors are connected to a PMOS common source line CSP.

Figure 5:
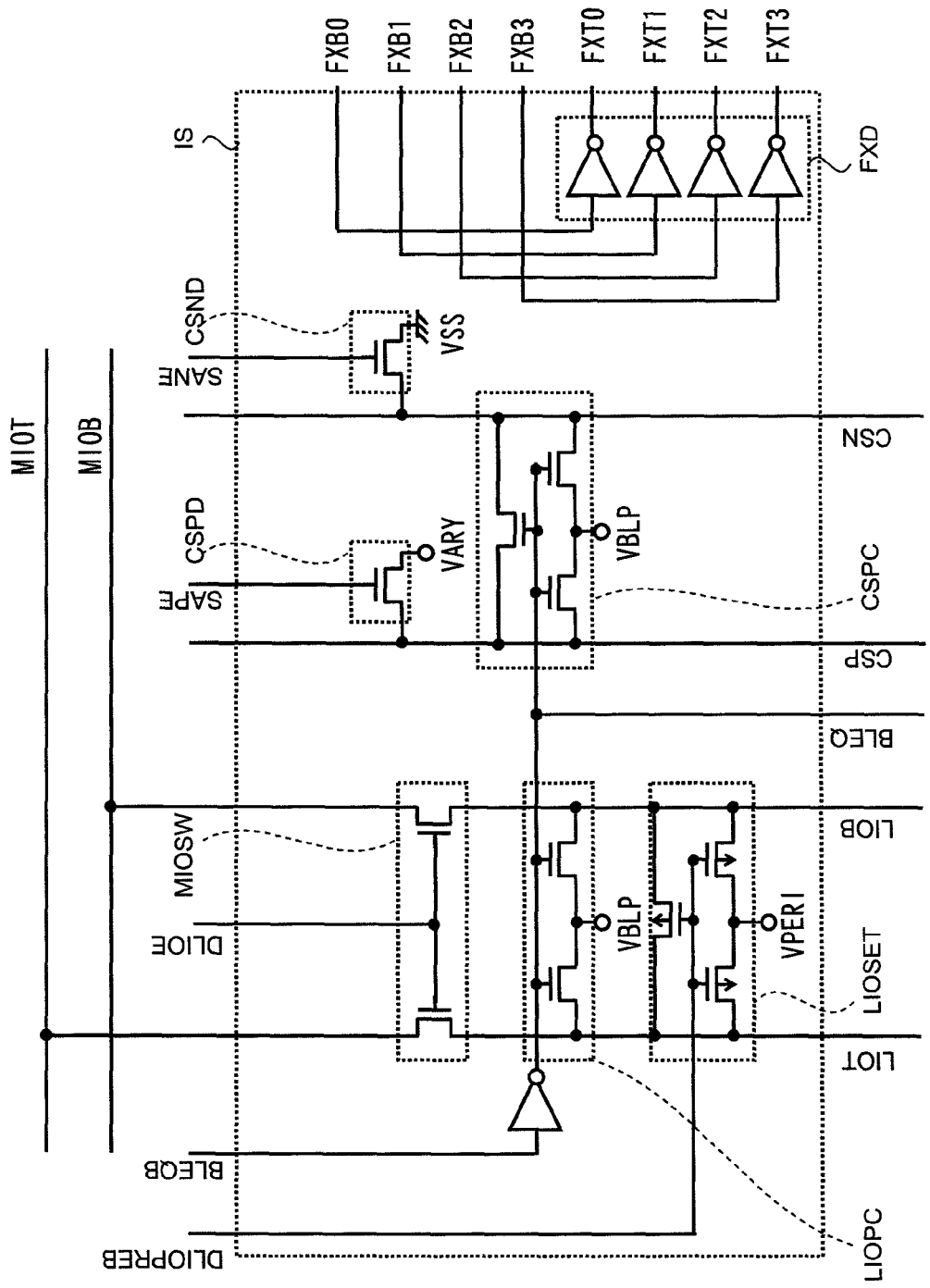
FIG. 5 is a configuration diagram of a cross area (IS)

FIG. 5 is a configuration diagram of the cross area IS (see FIG. 2 or 3). The cross area IS includes a local IO line pre-charge circuit LIOPC, a voltage drive circuit LIOSET, a main IO connection circuit MIOSW, a sub-word driver selection driver FXD, a common source line pre-charge circuit CSPC, a PMOS common source driver CSPD and a NMOS common source driver CSND.

The local IO line pre-charge circuit LIOPC includes two MOS transistors connected to the local IO line LIOT and the inverted local IO line LIOB respectively and is controlled by means of the bit line equalization signal BLEQ. In the standby state, the bit line equalization signal BLEQ is at the logical high level while the MOS transistors are in a conductive state. Hence the local IO line LIOT and the inverted local IO line LIOB are jointly pre-charged at a pre-charged electric potential VBLP.

The voltage drive circuit LIOSET includes three transistor connected to the local IO line LIOT and the inverted local IO line LIOB and is controlled by means of a local IO line control signal DLIOPREB. In an active standby state, the local IO line control signal DLIOPREB is at a logical low level (e.g. equal to a ground voltage VSS) and drives both of the local IO line LIOT and the inverted local IO line LIOB to an internal source voltage VPERI.

The main IO connection circuit MIOSW includes two MOS transistors, one of which is adapted to connect the local IO line LIOT with the main IO line MIOT while the other of which is adapted to connect the inverted local IO line LIOB with the inverted main IO line MIOB. The main IO connection circuit MIOSW is controlled by means of an IO line enable signal DLIOE. During reading or writing, when the IO line enable signal DLIOE becomes at a logical high level, the local IO lines LIOs (LIOT and LIOB) are electrically connected to the main IO lines MIOs (MIOT and MIOB).

The sub-word driver selection driver FXD generates sub-word driver selection signals FXTs (0-3) from inverted sub-word driver selection signal FXBs (0-3).

The common source line pre-charge circuit CSPC includes three MOS transistors connected to the PMOS common source line CSP and the NMOS common source line CSN and is controlled by means of the bit line equalization signal BLEQ. In the standby state, the bit line equalization signal BLEQ is at the logical high level and the MOS transistors are in a conductive state. As a result, the PMOS common source line CSP and the NMOS common source line CSN are jointly pre-charged at the pre-charged electric potential VBLP.

The PMOS common source driver CSPD includes a MOS transistor and is controlled by means of a sense amplifier PMOS enable signal SAPE. During an operation of the cross coupling amplifier, the sense amplifier PMOS enable signal SAPE is at the logical high level and the PMOS common source driver CSPD drives the PMOS common source line CSP to the array voltage VARY.

The common source driver CSND includes a MOS transistor and is controlled by means of a sense amplifier NMOS enable signal SANE. During the operation of the cross coupling amplifier, the sense amplifier NMOS enable signal SANE is at the logical high level and the NMOS common source driver CSND drives the NMOS common source line CSN to the ground voltage VSS.

Figure 6:
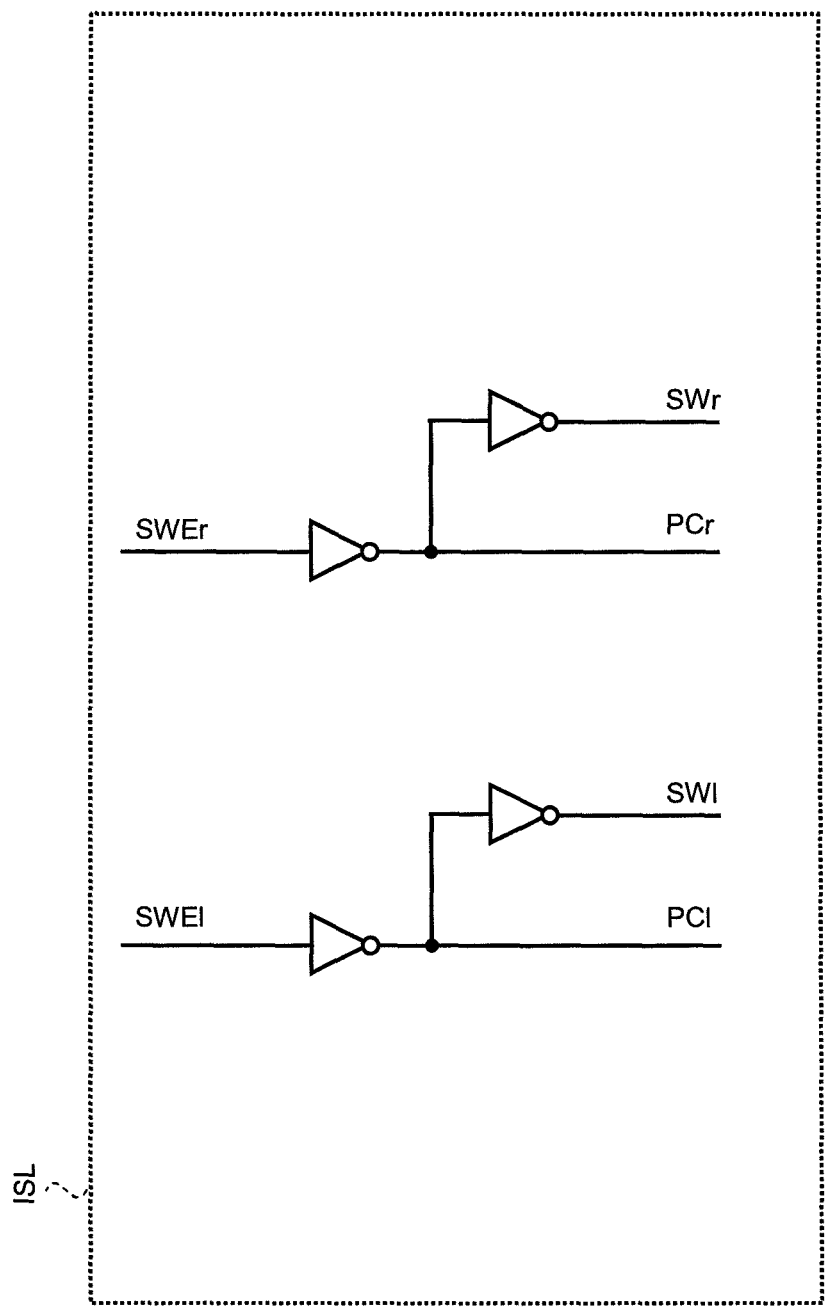
FIG. 6 is a configuration diagram of a control circuit (ISL) of a bit line connection switch array included in a sub-ward driver array (SWDA)

FIG. 6 is a configuration diagram of a control circuit ISL for the bit line connection switch arrays included in the sub-word driver array SWDA (see FIG. 3).

The control circuit ISL generates signals to control the bit line connection switch arrays BSSEs, BSSPEs, BSSs and BSSPs. That is, the control circuit ISL generates control signals for controlling the switch MOS transistors which couple the global bit line GBLT with the local bit line (LBL shown in FIG. 9) and for controlling the pre-charge MOS transistors.

The control circuit ISL includes four inverters which form two systems. The control circuit ISL generates, in one of the systems, a pre-charge signal PCl from a connection switch control signal SWEl by means of one of the inverters. Furthermore, the control circuit ISL generates a connection signal SWl from the pre-charge signal PCl by means of another one of the inverters. Similarly, the control circuit ISL generates, in the other of the systems, a pre-charge signal PCr from a connection switch control signal SWEr by means of one of the inverters and a connection signal SWr from the pre-charge signal PCr by means of another one of the inverters.

Figure 7:
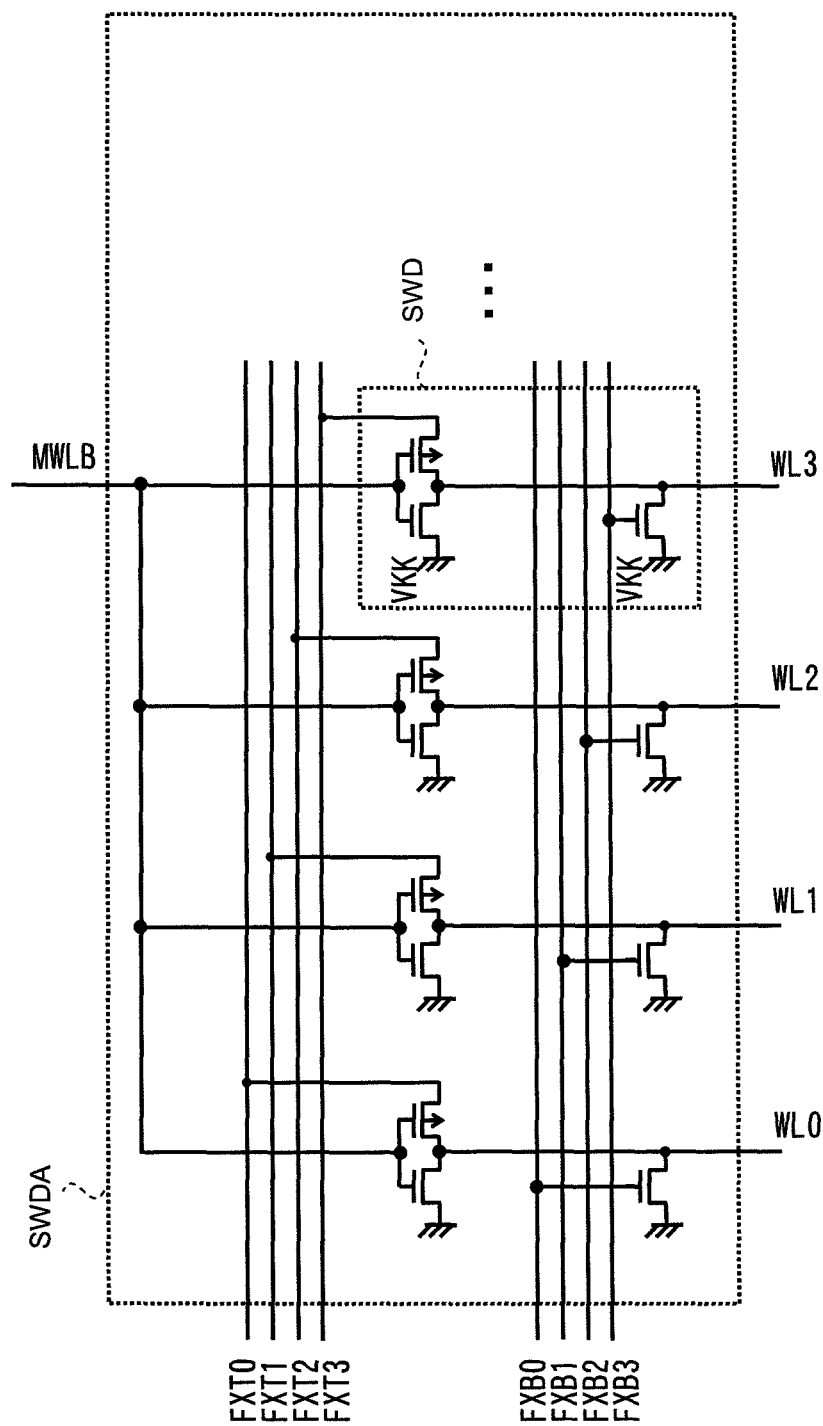
FIG. 7 is a configuration diagram of the sub-ward drive array (SWDA) except for the control circuit (ISL)

FIG. 7 is a configuration diagram of the sub-word driver array SWDA except for the control circuit ISL. As mentioned above, two sub-word driver arrays SWDAs are located at both sides (upper and lower sides in FIG. 3) of the memory cell array MCA. Each of the word lines WLs included in the memory cell array MCA is driven by either of the sub-ward driver arrays SWDA located at the both sides of the memory cell array MCA. Hence, the number of sub-word drivers SWDs in each of the sub-word driver arrays SWDAs may be equal to a half of that of the word lines WLs in the memory cell array MCA.

The sub-word driver SWD includes a PMOS transistor and two NMOS transistors. Regarding the PMOS transistor, a gate, a source and a drain are connected to an inverted main word selection signal MWLB, the sub-word driver selection signal FXT and the word line WL, respectively. Regarding one of the NMOS transistors, a gate, a source and a drain are connected to the inverted main word selection signal MWLB, a voltage VKK lower than the ground voltage VSS and the word line WL, respectively. Regarding the other of the NMOS transistors, a gate, a source and a drain are connected to the inverted sub-word driver selection signal FXB, the voltage VKK and the word line WL.

Figure 8:
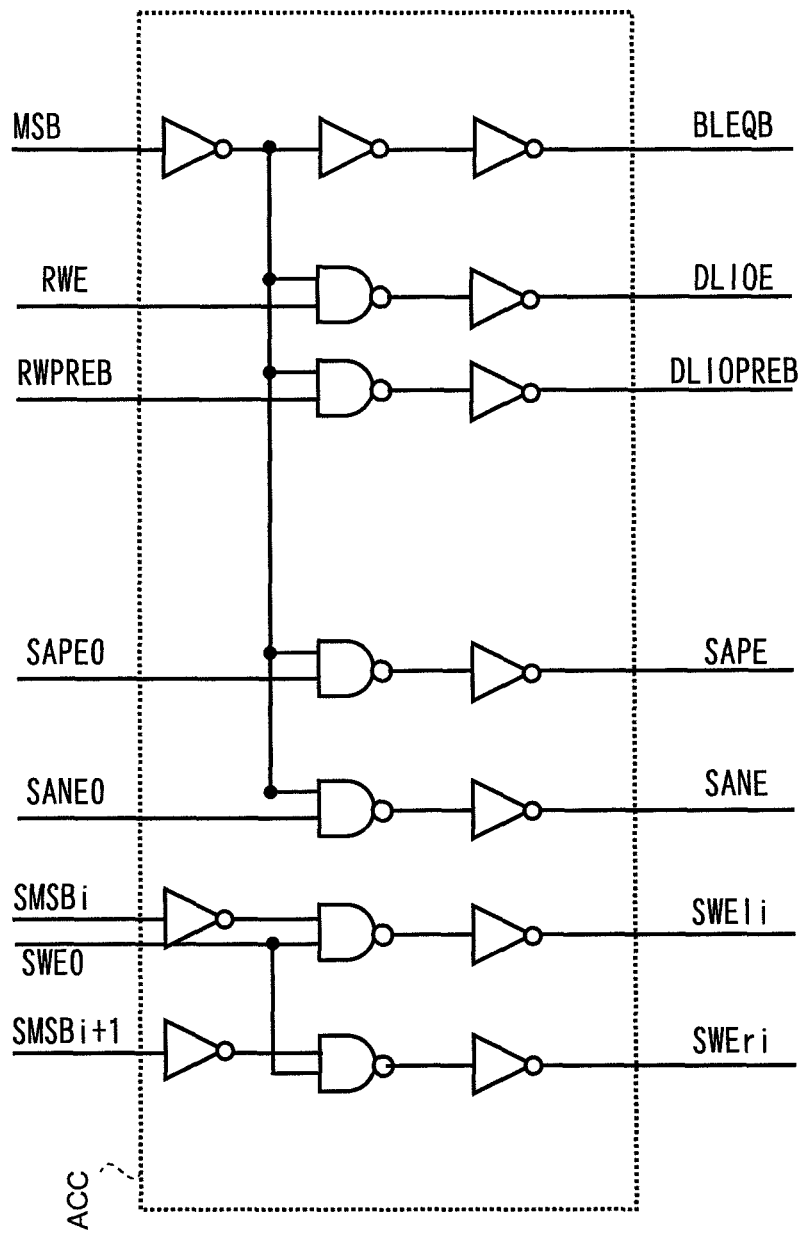
FIG. 8 is a configuration diagram of an array control circuit (ACC)

FIG. 8 shows a configuration of the array control circuit ACC (see FIG. 2). The array control circuit ACC generates signals to control the sense amplifiers SAs, the IO lines and the bit line connection switch array. Specifically, the array control circuit ACC generates the bit line equalization signal BLEQ from a mat selection inverted signal MSB supplied from the control circuit and input output circuit PERI. The array control circuit ACC furthermore generates the IO line enable signal DLIOE from the mat selection inverted signal MSB and a reading writing enable signal RWE. The array control circuit ACC still furthermore generates the local IO line control signal DLIOPREB from the mat selection inverted signal MSB and a reading writing pre-charge inverted signal RWPREB. Moreover, the array control circuit ACC generates the sense amplifier PMOS enable signal SAPE from the mat selection inverted signal MSB and a sense amplifier PMOS enable original signal SAPE0 and generates the sense amplifier NMOS enable signal SANE from the mat selection inverted signal MSB and a sense amplifier NMOS enable original signal SANE0. The array control circuit ACC generates a switch enable signal SWEli from a left side sub-memory cell array selection signal SMSBi for the bit line connection switch array and a switch enable original signal SWE0 and generates a switch enable signal SWEri from a right side sub-memory cell array selection signal SMSBi+1 for the bit line connection switch array and the switch enable original signal SWE0.

Figure 9:
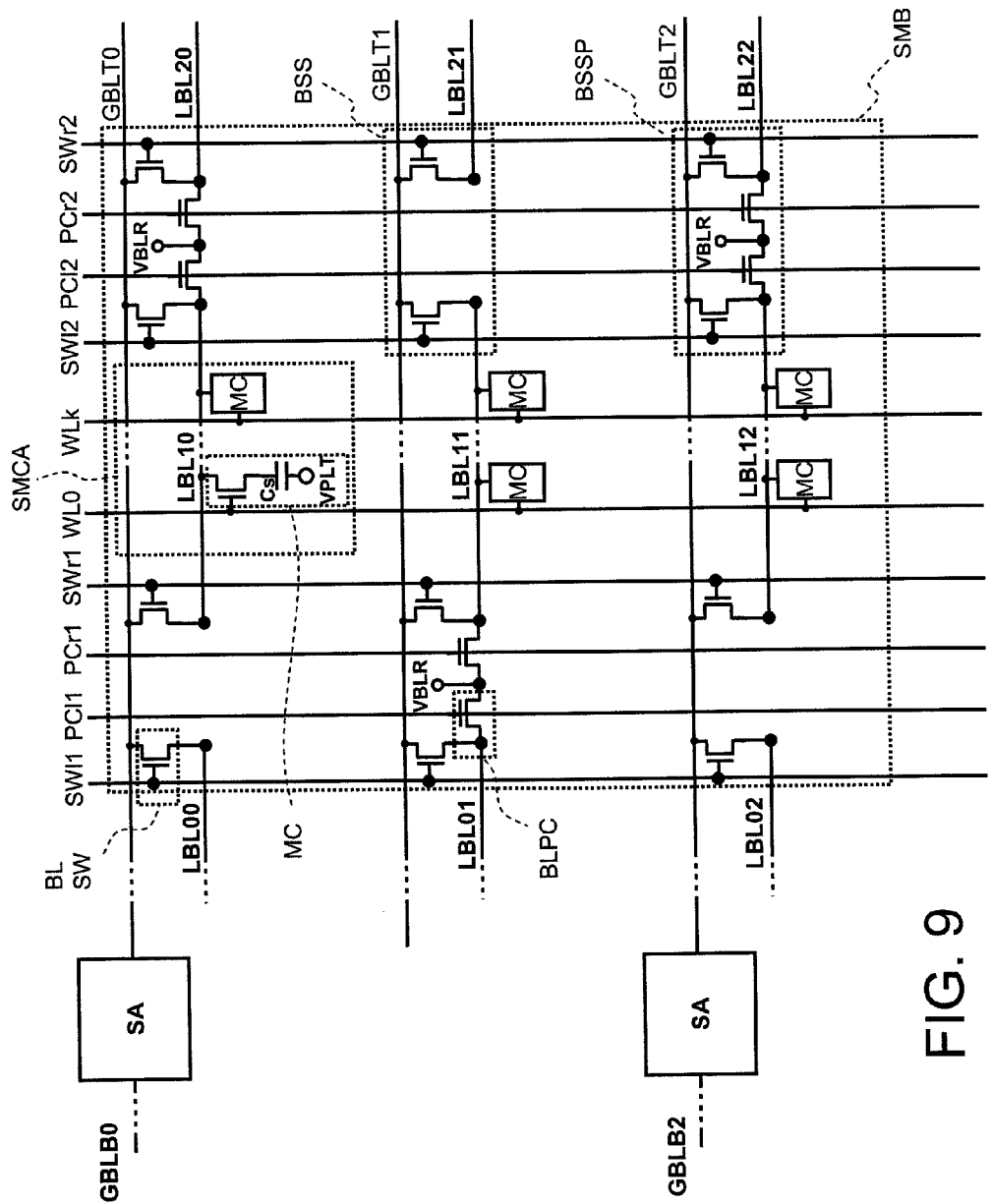
FIG. 9 is a configuration diagram of a sub-memory block (SMB)

FIG. 9 is a configuration diagram of the sub-memory block SMB (see FIG. 3). The sub-memory block SMB is corresponding to one placed at the top of the second column from the left side in FIG. 3. The other sub-memory blocks SMBs are configured like that of FIG. 9. Each of the bit line connection switch arrays BSSEs and BSSPEs consists of a part of the bit switch array BSS or BSSP.

The sub-memory block SMB of FIG. 9, as mentioned above, includes the three sub-memory cell arrays SMCAs. These three sub-memory cell arrays SMCAs are provided to be corresponding to the global bit lines GBL0-GBL2 respectively.

The three sub-memory cell arrays SMCAs share the plural word lines WLs (0-k). The three sub-memory cell arrays SMCAs each includes a local bit line LBL (10-12). The sub-memory cell arrays SMCAa have memory cells MCs which are placed to correspond to intersection points of the plural word lines WLs (0-k) and the local bit lines LBLs respectively.

The memory cell may be a dynamic random access memory (DRAM) referred as to a 1T1C type that is formed of a combination of an NMOS transistor and a capacitor adapted to hold electric charges as information. Regarding the NMOS transistor, a source is connected to the local bit line LBL while a gate is connected to the word line WL. The capacitor is connected between a drain of the NMOS transistor and a cell plate electric potential VPLT.

The sub-memory block SMB has the bit line connection switch arrays BSS and BSSP at both sides of each of the sub-memory cell array SMCA. The bit line connection switch array BSS includes a pair of switch MOS transistors BLSWs while the bit line connection switch array BSSP includes a pair of switch MOS transistors BLSWs and a pair of pre-charge MOS transistors BLPC.

One of ends of each local bit line LBL is connected to one of the pair of the switch MOS transistors BLSWs included in the bit line connection switch array BSS while the other of the ends of each local bit line LBL is connected to one of the pair of the switch MOS transistors BLSWs included in the bit line connection switch array BSSP.

The switch MOS transistors BLSWs are controlled by means of the connection (control) signal SWs (r1-r2, l1-l2) to electrically connect between the global bit lines GBLs and the local bit lines LBLs. When the connection signals SWs for the global bit line and the local bit line are at high level, the global bit lines and the local bit lines are electrically connected to one other. At this time, it becomes possible to execute an operation for reading out the information stored in the corresponding memory cell MC or for writing the information to the corresponding memory cell MC. Specifically, each global bit line GBL is connected to a plurality of local bit lines LBLs, which are elongated in the same direction (i.e. a horizontal direction in FIG. 9) as that of the global bit line GBL and arranged in a row along with the global bit line GBL, via a plurality of switch MOS transistors. Then, any one of the local bit lines LBLs arranged in a row is selectively allowed to be electrically connected to the corresponding global bit line GBL. A plurality of local bit lines LBLs arranged in a direction crossing the global bit lines GBLs (i.e. a vertical direction in FIG. 9) are allowed to be electrically connected to the global bit lines GBLs at the same time. For example, in FIG. 9, the local bit lines LBLs 10, 11 and 12 are electrically connected to the global bit lines GBLT0, GBLT1 and GBLT2 respectively at the same time via the switch MOS transistors BLSWs controlled by the means of the connection signals SWr1 and SWl2.

The pre-charge MOS transistors BLPCs are controlled by means of the pre-charge signals PCs (r1-r2, l1-l2). When the pre-charge signal PC is at a high level, the corresponding local bit line LBL is pre-charged to the pre-charged electrical potential VBLP.

The sense amplifiers SAs are connected to one ends of the global bit lines GBLTs. Though FIG. 9 shows that no sense amplifier SA is connected to the global bit line GBLT1, the global bit line GBLT1 is connected to a sense amplifier SA at a right side end thereof. Each of the sense amplifiers SAs is also connected to a inverted global bit line GBLB of the adjacent memory cell array MCA. In other words, the sense amplifier SA has a pair of input terminals that are connected to ones of the global bit lines GBLs of the memory cell arrays MCAs placed on both sides thereof.

Figure 10:
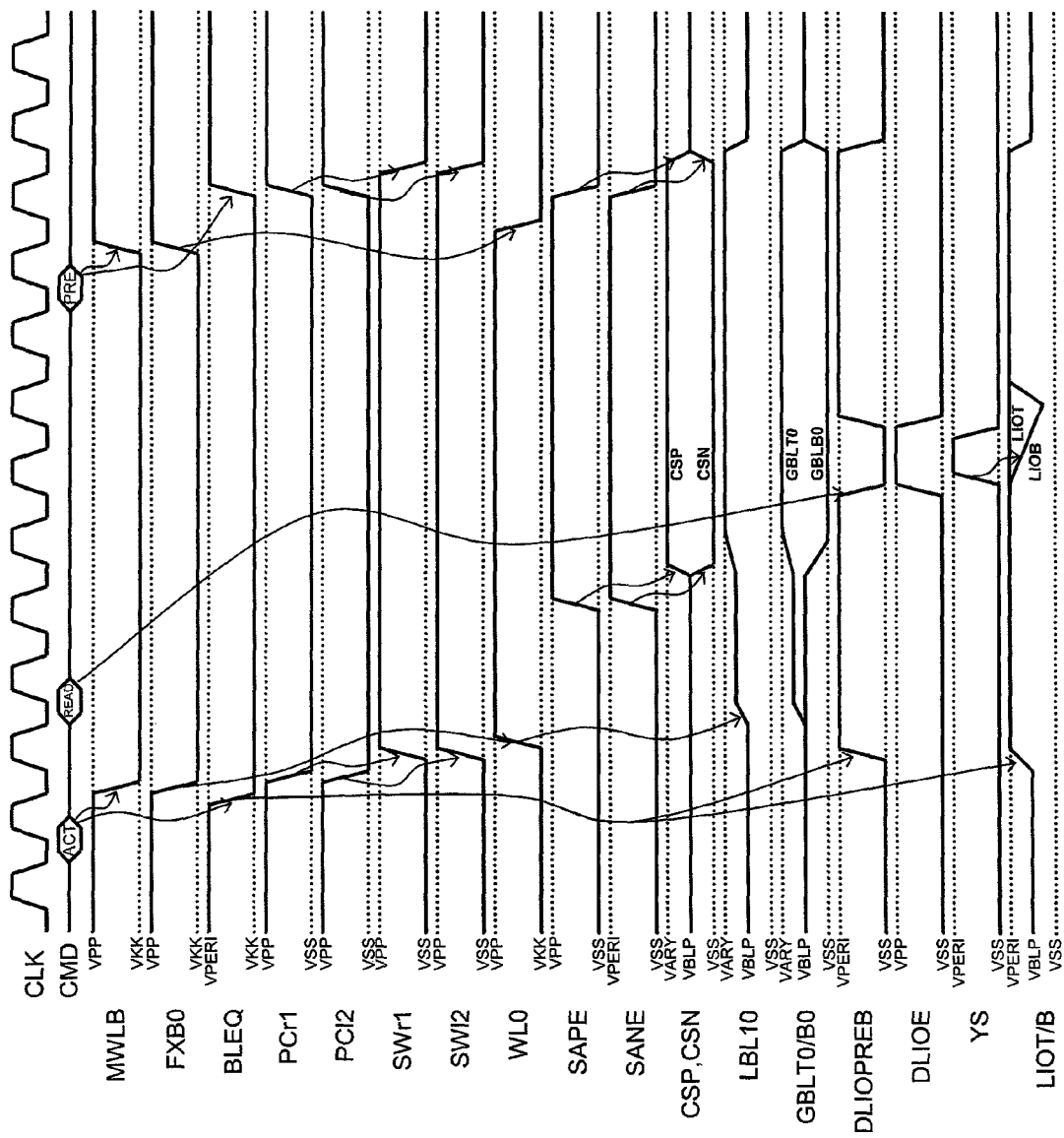
FIG. 10 is a wave form chart showing an example of operation wave forms in a case where information is read out from a memory cell (MC) in the circuit of FIG. 9 using the circuit of FIG. 4.

FIG. 10 shows an example of wave forms in a case where a reading operation is executed by the circuit illustrated in FIGS. 4 and 9 to read out information from a memory cell MC. Herein, the description will be made of a case where the word line WL0 is selected while the information of "HIGH" is memorized in the memory cell MC connected to local bit line LBL10.

At first, a standby state will be described. The local bit line LBL 10, the global bit line GBLT0 and the inverted global bit line GBLB0 have been pre-charged to the pre-charged electric potential VBLP. At this time, the pre-charge signals PCs (r1-r2, l1-l2) are equal to a boosted voltage VPP, the connection signals SWs (r1-r2, l1-l2) are equal to the ground voltage VSS and the word line WL0 is equal to a voltage VKK. The voltages are set to have a relation of VPP>VPERI>VARY>VBLP>VSS>VKK. The pre-charged voltage VBLP is equal to a half level of the array voltage VARY. The ground voltage VSS is equal to 0 volt while the voltage VKK is a negative voltage lower than the ground voltage VSS.

Upon inputting an ACT (or active) command, the main word selection signal MWLB and the bit line equalization signal BLEQ becomes equal to the voltage VKK. The voltage VKK of the bit line equalization signal BLEQ causes the local IO line control signal DLIOPREB to have an internal power source voltage VPERI, and the local IO line LIOT and the inverted local IO line LIOB are driven to the internal power source voltage VPERI from the pre-charged electrical potential VBLP. Then, the pre-charged signals PCr1 and PCl2 becomes equal to the ground voltage VSS. The local bit line LBL10 is shifted from a pre-charged state having the pre-charge electrical potential VBLP to a floating state. Furthermore, the connection signals SWr1 and SWl2 for the global bit line GBLT0 and the local bit line LBL10 becomes equal to the boosted voltage VPP. As a result, the global bit line GBLT0 and the one local bit line LBL10 are electrically connected to each other. After that, the inverted sub-word driver selection signal FXB0 becomes equal to the voltage VKK and thereby the word line WL0 is driven to the boosted voltage VPP. Thus, the information is read out from the memory cell MC. The read out information renders the local bit line LBL10 and the global bit line GBLT0 connected to the local bit line LBL10 via the switch MOS transistor BLSW to have a voltage higher than the pre-charged electric potential VBLP.

Subsequently, the sense amplifier enable signals SAPE and SANE become equal to the boosted voltage VPP. The NMOS common source CSN connected to the cross coupling amplifier CCA of the sense amplifier SA has a voltage changed from the pre-charged electric potential VBLP to the ground voltage VSS. The PMOS common source CSP has a voltage changed from the pre-charged electric potential VBLP to the array voltage VARY. Then, the sense amplifier SA amplifies the signal read out to the global bit line GBLT0 and the information is rewritten into the memory cell MC.

Next, upon inputting a READ (or read) command, the local IO line control signal DLIOPREB becomes equal to the ground voltage VSS while the IO enable signal DLIOE becomes equal to the boosted voltage VPP. Then, the column selection switch signal YS is driven from the ground voltage VSS to the internal power source voltage VPERI, and thereby the information is output to the local IO line LIO.

After that, upon inputting a PRE (or pre-charge) command, the word line WL0 becomes equal to the voltage VKK. The bit line equalization signal BLEQ, the pre-charged signals PCr1 and PCl2 become equal to the boosted voltage VPP. The sense amplifier enable signals SAPE and SANE and the connection signals SWr1 and SWl2 become equal to the ground voltage VSS. As a result, the common sources CSP and CNP, the global bit line GBL and the local bit line LBL10 are pre-charged to have the pre-charged voltage VBLP and thereby returning to the standby state. Thus, the reading operation is completed.

Figure 11:
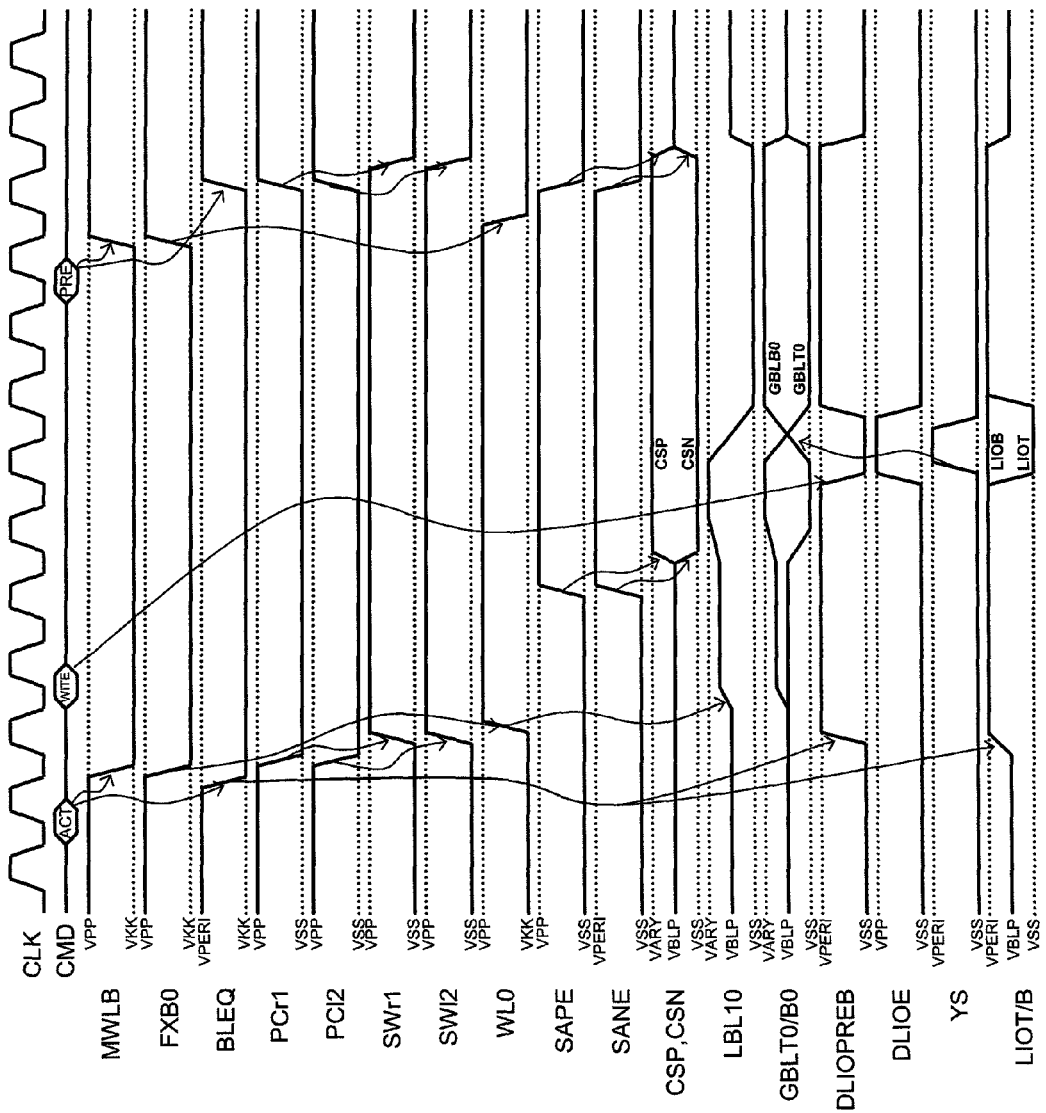
FIG. 11 is a wave form chart showing an example of operation wave forms in a case where information is write in a memory cell (MC) in the circuit of FIG. 9 using the circuit of FIG. 4.

FIG. 11 shows an example of wave forms in a case where a writing operation is executed by the circuit illustrated in FIGS. 4 and 9 to write information into the memory cell MC. Herein, the description will be made of a case where the word line WL0 is selected while the information of "LOW" (or the ground voltage VSS) is written in the memory cell MC connected to local bit line LBL10.

A standby state and an active state in the writing operation are similar to those in the reading operation mentioned above with reference to FIG. 10.

After becoming the active state, upon inputting a WITE (or write) command, the local IO line control signal DLIOPREB becomes equal to the ground voltage VSS while the IO line enable signal DLIOE becomes equal to the boosted voltage VPP. Then, the column selection switch signal YS is driven from the ground voltage VSS to the internal power source voltage VPERI, and writing information is transmitted from the local IO line LIO to the global bit line GBL. Furthermore, the global bit line GBLT0 becomes equal to the ground voltage VSS while the inverted global bit line GBLB0 becomes equal to the array voltage VARY. Thus, the information transmitted to the global bit line GBL is transmitted to the local bit line LBL10 through the switch MOS transistors BLSWs and then written into the memory cell MC. In this embodiment, the information of "LOW" (or the ground voltage VSS) is written in the memory cell MC. Because the switch MOS transistors BLSWs connected to the both ends of the local bit line LBL10 are in the conductive state, the writing of the information is performed from both ends of the local bit line LBL 10. Writing speed of this embodiment can be increased in comparison with the related technique in which the writing is performed from one end of a local bit line.

After that, upon inputting a PRE (or pre-charge) command, the word line WL0 becomes equal to the voltage VKK. The bit line equalization signal BLEQ, the pre-charged signals PCr1 and PCl2 become equal to the boosted voltage VPP. The sense amplifier enable signals SAPE and SANE and the connection signals SWr1 and SWl2 become equal to the ground voltage VSS. As a result, the common sources CSP and CNP, the global bit line GBL and the local bit line LBL10 are pre-charged to the pre-charged voltage VBLP and thereby returning to the standby state. Thus, the writing operation is completed.

Figure 12:
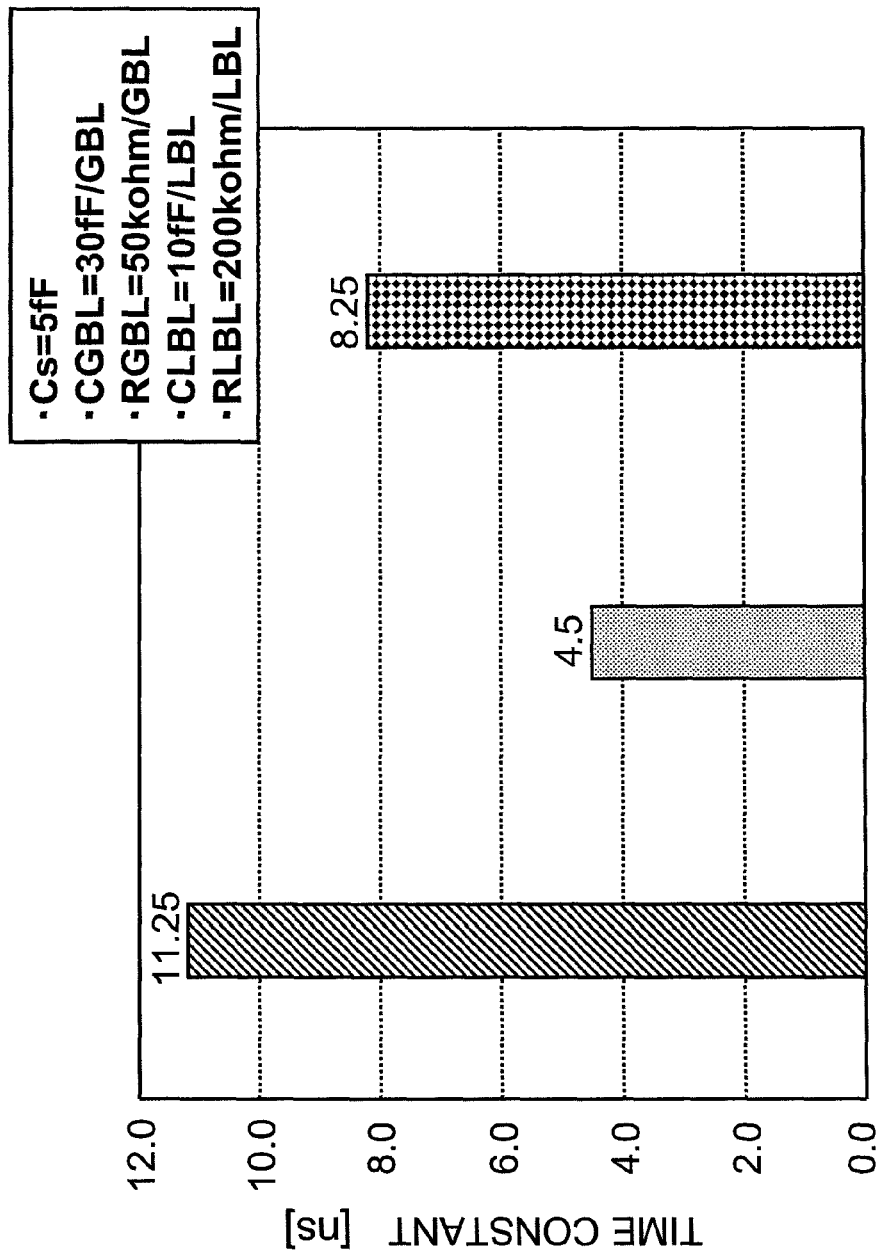
FIG. 12 is a graph for illustrating advantage of the semiconductor device according to the first embodiment.

Referring to FIG. 12, advantageousness of the device according to the embodiment will be described below. Herein, assumption is made as follows: a memory cell capacitance Cs=5 fF; a global bit line capacitance CGBL=30 gF/GBL; a global bit line resistance RGBL=50 kΩ/GBL; a local bit line capacitance CLBL=10 fF/LBL; and a local bit line resistance RLBL=200 kΩ/LBL.

In FIG. 12, the horizontal axis represents compared items while the vertical axis represents a time constant. Each of the time constants in FIG. 12 is a time constant of R×C [ns] for a memory cell having the slowest writing speed.

A related semiconductor device has a hierarchical bit line structure while either end of each local bit line is connected to a switch MOS transistor. In this structure, the memory cell having the slowest writing speed is a memory cell that is located at the other end of the local bit line connected to the furthermost switch MOS transistor from a sense amplifier. The time constant of the memory cell is found by the following equation:

$$(RGBL+RLBL) \times (CGBL+CLBL+Cs)=11.25 \text{ ns.}$$

On the other hand, in the semiconductor device according to this embodiment, the memory cell having the slowest writing speed is a memory cell that is located at an approximately middle of the local bit line connected between the furthermost switch MOS transistor from a sense amplifier and the second-furthermost switch MOS transistor. With this structure, the resistance from one of the switch MOS transistors connected to both ends of the local bit line to the middle of the local bit line is equal to RLBL/2. Furthermore, the local bit line can be driven by the switch MOS transistors connected to both ends thereof. Consequently, a combined resistance from the switch MOS transistors connected to the both ends of the local bit line to the memory cell connected to the middle of the local bit line is equal to (RLBL/2)/2=RLBL/4. Thus, the time constant of the memory cell is found by the following equation:

$$(RGBL+RLBL/4) \times (CGBL+CLBL+Cs)=4.5 \text{ ns.}$$

Thus, according to this embodiment, it is possible to improve the writing speed twice or more in comparison with the related semiconductor device. Additionally, resistance of the global bit line between the switch MOS transistors being in the conductive state is negligible because it is remarkably smaller than that of the local bit line.

The configuration of the semiconductor device according to the embodiment is particularly effective in a case where the local bit line has relatively large resistance, or the resistance is dominant in the time constant.

In the configuration of the semiconductor device according to the embodiment, the writing speed is higher than that of the related semiconductor device even if the local bit line has a twice length of that of the related semiconductor device. In such a case, the time constant is found by the following equation:

$$(RGBL+2 \times RLBL/4) \times (CGBL+2 \times CLBL+Cs)=8.25 \text{ ns.}$$

As mentioned above, the resistance of the global bit line between the switch MOS transistors being in the conductive state is negligible because it is remarkably smaller than that of the local bit line.

If the length of the local bit line is doubled, the number of switch MOS transistors can be made a half. In other words, when two short local bit lines are replaced with a long local bit line which has a doubled length of the short local bit line, two pairs of switch MOS transistors for the two short local bit lines can be replaced with one pair of switch MOS transistors for the long bit line. As a result, the layout area of the semiconductor device according to the embodiment can be reduced.

Figure 13:
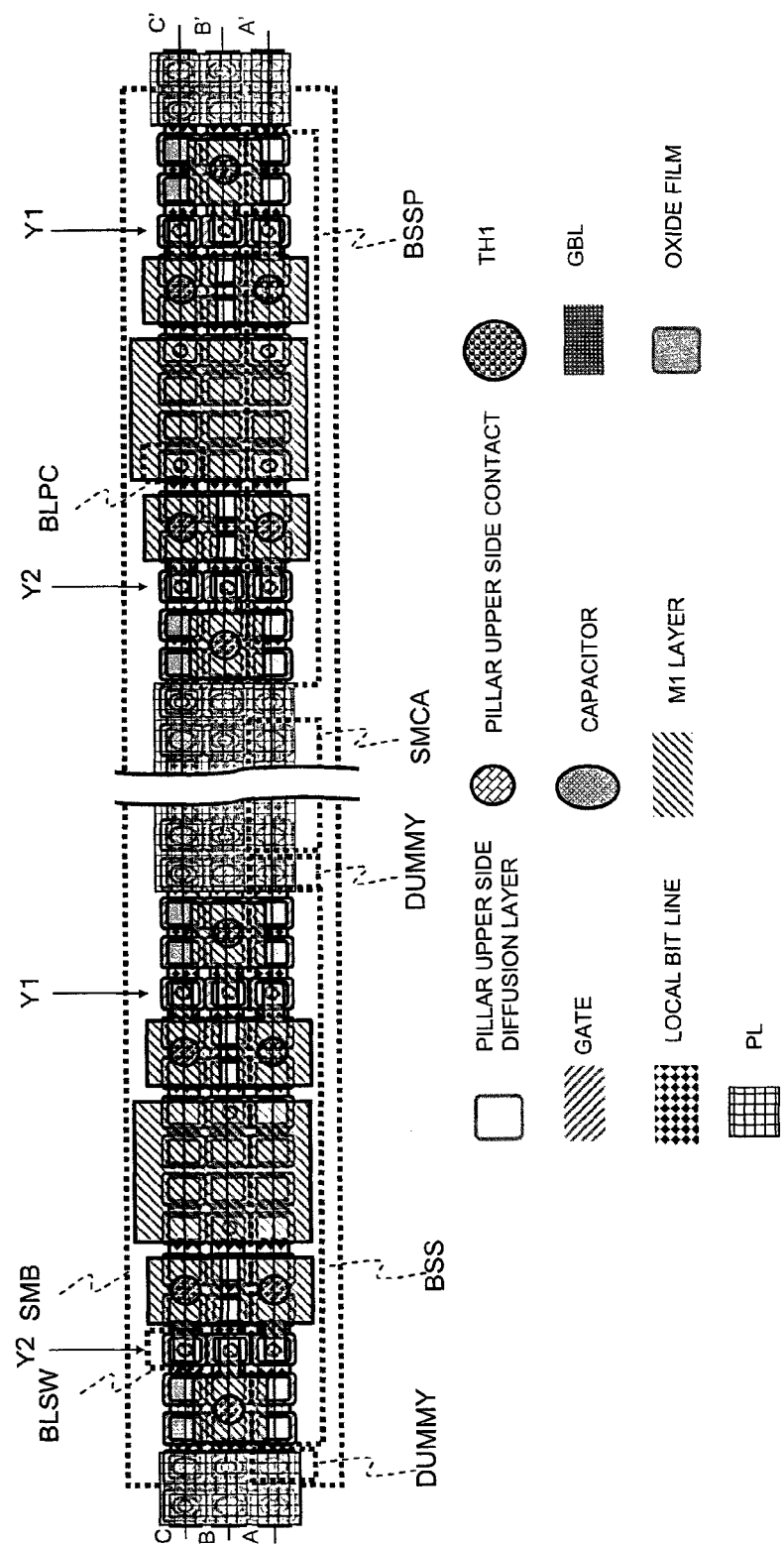
FIG. 13 is a layout chart showing an example of a layout of the sub-memory block (SMB)
Figure 14:
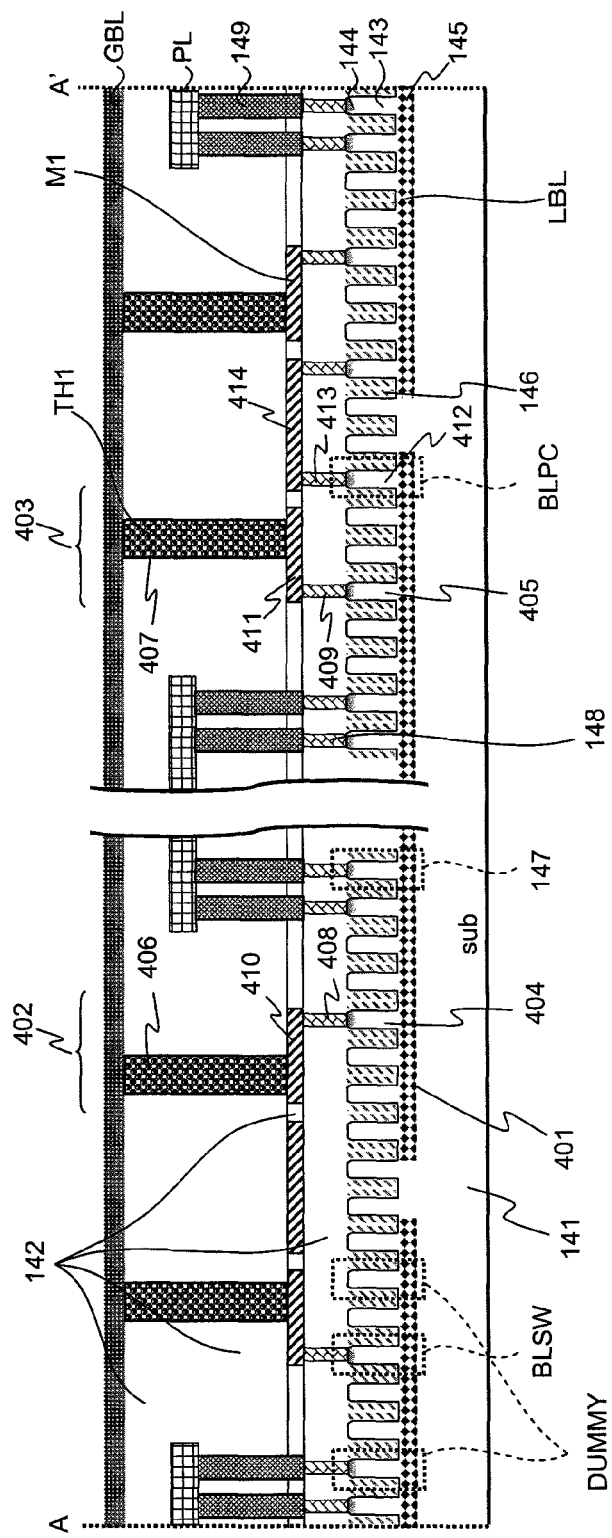
FIG. 14 is a sectional view taking along a line A-A' of FIG. 13.
Figure 15:
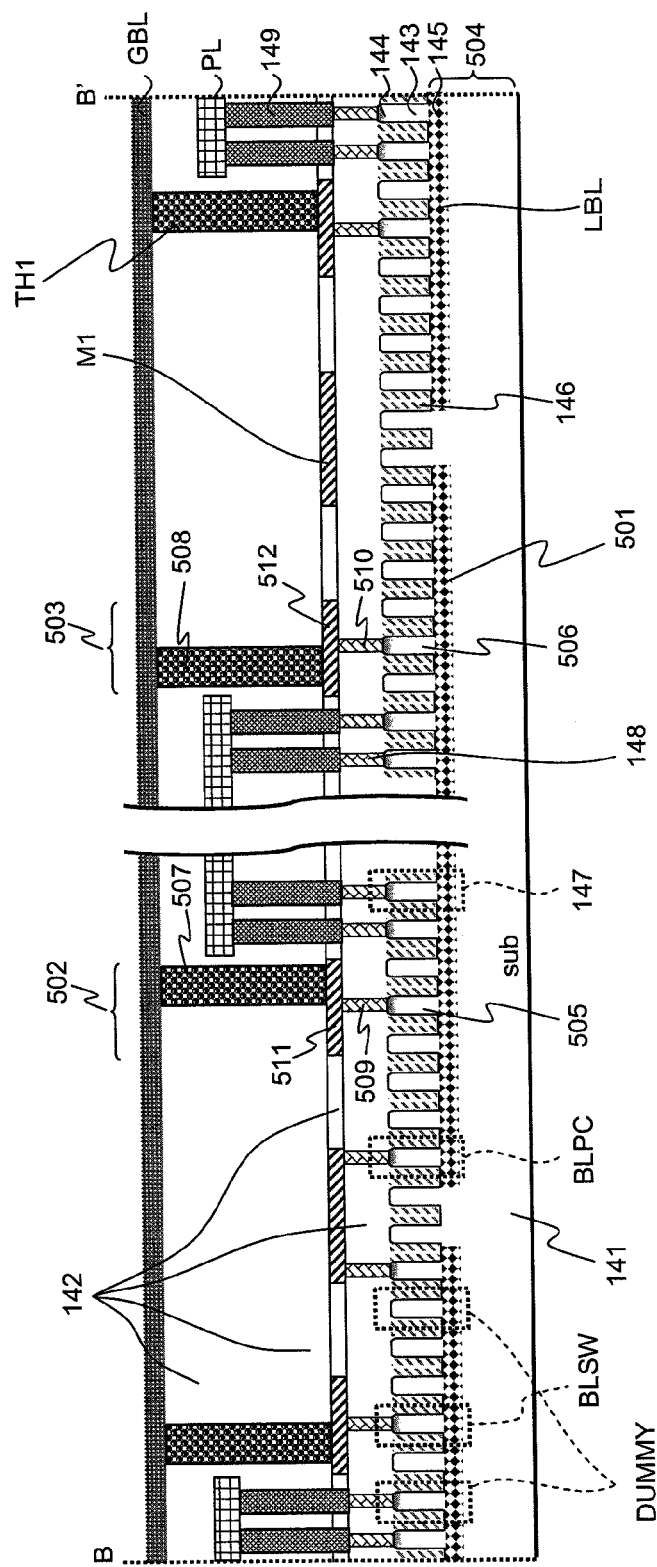
FIG. 15 is a sectional view taking along a line B-B' of FIG. 13.

FIG. 13 shows an example of an layout of the sub-memory block SMB. FIGS. 14 and 15 show sectional views taking along lines A-A' and B-B' of FIG. 13, respectively. In FIGS. 13-15, the same hatching is given to the same materials. A sectional view taking along a line C-C' of FIG. 13 is similar to that of the line A-A'. For the purpose of visibility, the global bit lines GBLs are omitted in FIG. 13. If the global bit lines GBLs were depicted in FIG. 13, there would be three global bit lines GBLs that are elongated in a horizontal direction of FIG. 13 and arranged in a vertical direction of FIG. 13 in parallel with one another.

The layout illustrated in FIG. 13 is for what is called a $4F^2$ cell array in which vertical MOS transistors are used as the cell transistors included in the memory cells MCs, the switch MOS transistors and the pre-charge MOS transistors. Each of the vertical MOS transistors has a channel region formed in a vertical direction (i.e. a direction perpendicular to the sheet surface of FIG. 13 or a vertical direction of FIG. 14).

As understood from FIG. 14, the semiconductor device has a semiconductor substrate 141 and a multi-tiered wiring layer formed thereon. In the multi-tiered wiring layer, interlayer insulating films 142 and wiring layers (M1, PL and GBL) are laminated.

At an upper surface side of the semiconductor substrate 141 is formed and arranged a plurality of columnar pillars 143. At the tips of some of the pillars 143 are formed diffusion layers 144. At bottoms of some of the pillars 143 and their peripheries are formed other diffusion layers 145. The diffusion layers 145 forms the local bit lines LBLs elongated in the horizontal direction of FIG. 14. The local bit lines LBLs are formed by forming diffusion layers at predetermined regions and then, in each region, removing parts of the diffusion layer that are extending the horizontal direction of FIG. 13 between pillars 143 adjacent to each other in the vertical direction of FIG. 13. When the pillar 143 is used for a transistor, the diffusion layer 144 being at its tip serves as a drain while the diffusion layer 145 being at its bottom serves as a source (and a local bit line LBL). Around the side surface of the pillar 143 is formed a gate 146 through the intermediary of an insulating film.

The transistor including the pillar 143 is used for any one of the memory cell transistor, the switch MOS transistor, the pre-charge MOS transistor and a dummy MOS transistor (DUMMY).

On each transistor included in the sub-memory cell array SMCA, i.e. each of the memory cell array transistors 147, is formed a pillar upper side contact 148. On the pillar upper side contact 148 is formed a cell capacitor (Cs) 149. A drain (or the diffusion layer 144) of the memory cell transistor 147 is coupled to the cell capacitor 149 through the pillar upper side contact 148. The other end of the cell capacitor 149 is coupled to a plate wiring layer PL and supplied with a cell plate electrical potential VPLT.

A gate 146 of the memory cell transistor 147 forms the word line WL which is elongated in the vertical direction of FIG. 13.

Transistors located at both sides of the sub-memory cell array SMCA are dummy transistors (DUMMYs). In other words, between the sub-memory cell array SMCA and the bit line connection switch arrays BSS and between the sub-memory cell array SMCA and the bit line connection switch array BSSP, dummy cells, each of which has the same structure as the memory cell MC, are located. This is made to reduce manufacturing variability of shape of outermost memory cells MCs of the sub-memory cell array SMCA.

On the switch MOS transistors BLSWs included in the bit line connection switch arrays BSS and BSSP are also formed the pillar upper side contacts 148. The pillar upper side contacts 148 on the switch MOS transistors BLSWs are coupled to the M1 wiring lines which are upper layer wiring lines. On the M1 wiring lines are formed contacts TH1s coupled to the global bit lines GBLs. Thus, drains of the switch MOS transistors BLSWs are coupled to the global bit lines GBLs through the pillar upper side contacts 148, the M1 wiring lines and the contacts TH1s.

It is hard to arrange the contacts TH1s at 2F pitches, which are employed for the bit lines, in consideration of their characteristics and a process yield. Here F represents a feature size. Consequently, the contacts TH1s, as understood from FIG. 13, are alternately arranged at both sides of the switch MOS transistors BLSWs (or arranged in stagger or zigzag). This allows securing a distance equal to 4F or more between adjacent contacts TH1s.

The M1 wiring lines are provided for achieving the stagger or zigzag arrangement of the contacts TH1s. To secure regions for the M1 wiring lines, two rows of dummy transistors are located at both sides, in the horizontal direction of FIG. 13, of the switch MOS transistors BLSWs. In these dummy transistors, the tips of the pillars are covered with the interlayer insulating layer 142. At the tips of the pillars of the dummy transistors are formed no diffusion layers 144. Also, above the dummy transistors are formed neither the pillar upper side contacts 148 nor the cell capacitors 149. However, the diffusion layers 145 are formed at bottoms of the dummy MOS transistors and their peripheries.

The pillar upper side contacts 148 are also formed on the pre-charge transistors BLPCs included in the bit line connection switch array BSSP. The pillar upper side contacts 148 on the pre-charge transistors BLPCs are coupled to the M1 wiring lines. The M1 wiring line coupled to the pillar upper side contact 148 above the pre-charge transistor BLPC is electrically independent from that above the switch MOS transistor BLSW and supplied with the pre-charge electric potential VBLP.

Between a pair of pre-charge transistors BLPCs adjacent to each other in the horizontal direction of FIG. 13, two dummy MOS transistors are located. At the bottoms of these dummy MOS transistors and their peripheries is formed no diffusion layer 145. That is, these dummy MOS transistors are located at a region for isolating local bit lines LBLs adjacent to each other in the horizontal direction of FIG. 13. Furthermore, as understood from FIG. 13, the pre-charge MOS transistors BLPCs and dummy MOS transistors are alternately arranged in a direction along the word line (or in the vertical direction of FIG. 13).

In the embodiment, the switch MOS transistors are connected to the both ends (or their vicinities) of the local bit line. Here it is assumed that the switch MOS transistor is connected to either end of the local bit line. In such a case, switch MOS transistors BLSWs and dummy MOS transistors are alternately arranged in the direction along the word line like as the pre-charge MOS transistors BLPCs and dummy MOS transistors are alternately arranged in the direction along the word line. In this embodiment, the dummy MOS transistors are substituted by switch MOS transistors BLSWs. Thus, increase of the layout area of the semiconductor device according to the embodiment can be suppressed.

FIG. 15 shows an sectional view taking along a line B-B' of FIG. 13. As understood from the description mentioned above, the semiconductor device according to the embodiment includes the semiconductor substrate (141 in FIG. 15), a first local bit line (501 in FIG. 15) formed to be embedded in the semiconductor substrate and elongated in a first direction (a horizontal direction of FIG. 15), the first insulating layer (142 in FIG. 15) formed on the semiconductor substrate, the first global bit line (GBL in FIG. 15) formed on the first insulating layer, a first path (502 in FIG. 15 (BLSW, the pillar upper side contact 148, the M1 wiring line and the contact TH1)) adapted to couple one end of the first local bit line with the first global bit line, and a second path (503 in FIG. 15 (BLSW, the pillar upper contact 148, the M1 wiring line and the contact TH1)) formed to be embedded in the first insulating layer and adapted to couple the other end of the first local bit line and the first global bit line.

The semiconductor substrate possesses a first part (504 in FIG. 15) and second and third parts (505 and 506 in FIG. 15) which are projected from the first part. The second part includes a diffusion layer (144 in FIG. 15) formed at one end thereof. The other end of the second part is coupled with one end of the first local bit line. The third part includes a diffusion layer (144 in FIG. 15) formed at one end thereof. The other end of the third part is coupled with the other end of the first local bit line. The first and the second paths include the second and the third parts respectively.

The semiconductor device according to the embodiment further includes first and second through holes (or the contacts TH1s of FIG. 15: 507 and 508) formed in the first insulating layer and coupled with the first global bit line, first and second upper side contacts (509 and 510 in FIG. 15) formed in the first insulating layer and coupled to one ends of the second and the third parts respectively, a first wiring layer (511 in FIG. 15) formed in the first insulating layer and located between the first through hole and the first upper side contact, and a second wiring layer (512 in FIG. 15) formed in the first insulating layer and located between the second through hole and the second upper side contact. The first path includes the first through hole, the first upper side contact and the first wiring layer while the second path includes the second through hole, the second upper side contact and the second wiring layer.

The semiconductor device according to the embodiment still further includes a plurality of second local bit lines (401 in FIG. 14, the same is shown in a sectional view taking along a line C-C', and so forth) formed to be embedded in the semiconductor substrate and elongated in the first direction and arranged along a second direction (the vertical direction of FIG. 13 or the direction perpendicular to the sheet surface of FIG. 14) intersecting the first direction to be substantially parallel with the first local bit line, a plurality of second global bit lines (GBL of FIG. 14) formed on the first insulating layer to be substantially parallel with the first global bit line and arranged along the second direction, a plurality of third paths (402 in FIG. 14) formed in the first insulating layer to couple one ends of the second local bit lines with corresponding ones of the second global bit lines respectively, and a plurality of fourth paths (403 in FIG. 14) formed in the first insulating layer to couple the other ends of the second local bit lines with corresponding ones of the second global bit lines respectively.

The semiconductor substrate further includes a plurality of fourth parts (404 in FIG. 14) and a plurality of fifth parts (405 in FIG. 14) which are projected from the first part. The fourth parts include diffusion layers (144 in FIG. 15) formed at one ends of them. The other ends of the fourth parts are coupled with one ends of corresponding ones of the second local bit lines respectively. The fifth parts include diffusion layers (144 in FIG. 15) formed at one ends of them. The other ends of the fifth parts are coupled with one ends of corresponding ones of the second local bit lines respectively. The third paths include the fourth parts respectively while the fourth paths include the fifth parts respectively.

As understood from FIG. 13, the second part and the fourth parts may be formed on a first imaginary straight line (shown by an arrow Y1) extending in the second direction while the third part and the fifth parts may be formed on a second imaginary straight line (shown by an arrow Y2) extending in the second direction. Alternatively, as mentioned later (see FIG. 16), the second part and the fourth parts may be located in a staggered arrangement along the second direction while the third part and the fifth parts may be located in a staggered arrangement along the second direction.

The semiconductor device according to the embodiment still further includes a plurality of third and forth through holes (TH1 or 406 and 407 in FIG. 14) each of which is formed in the first insulating layer to be couple with corresponding one of the second global bit lines, a plurality of third upper side contacts (408 in FIG. 14) formed in the first insulating layer to be coupled with one ends of corresponding ones of the fourth parts, a plurality of fourth upper side contacts (409 in FIG. 14) formed in the first insulating layer to be coupled with one ends of corresponding ones of the fifth parts, a plurality of third wiring layers (410 in FIG. 14) each of which is formed in the first insulating layer to be located (and coupled) between corresponding one of the third through holes and corresponding one of the third upper side contacts, and a plurality of fourth wiring layers (411 in FIG. 14) each of which is formed in the first insulating layer to be located (and coupled) between corresponding one of the fourth through holes and corresponding one of the fourth upper side contacts. Each of the third paths includes corresponding one of the third through holes, corresponding one of the third upper side contacts and corresponding one of the third wiring layers while each of the fourth paths includes corresponding one of the fourth through holes, corresponding one of the third upper side contacts and corresponding one of the fourth wiring layers.

As understood from FIG. 13, the first through hole and the third through holes are arranged in two rows along the second direction while the second through hole and the fourth through holes are arranged in two rows along the second direction.

The second and the third portions form switches (BLSWs of FIG. 15) respectively.

The fourth and the fifth portions form switches (BLSWs of FIG. 14) respectively.

The semiconductor substrate still further possesses a sixth part (412 in FIG. 14) projected from the first part. The sixth part includes a diffusion layer (144 in FIG. 14) at one end thereof. The other end of the sixth part is coupled with one or the other end of the first local bit line.

The semiconductor device possesses a fifth upper side contact (413 in FIG. 14) formed in the first insulating layer to be coupled with one end of the sixth part and a fifth wiring layer (414 in FIG. 14) formed in the first insulating layer to be coupled with the fifth upper side contact.

Figure 16:
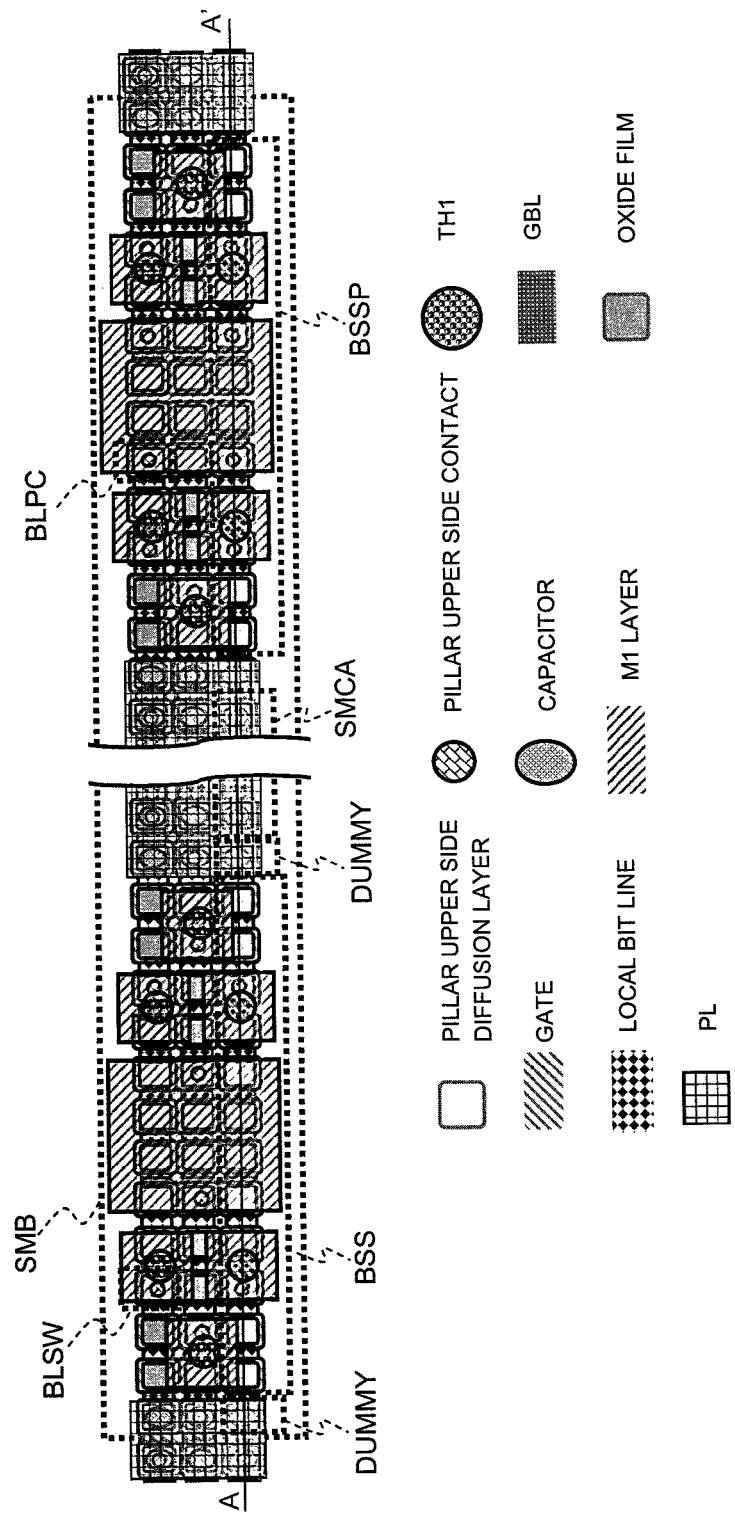
FIG. 16 is a layout chart showing an example of a layout of a sub-memory block (SMB) according to a second embodiment of this invention.
Figure 17:
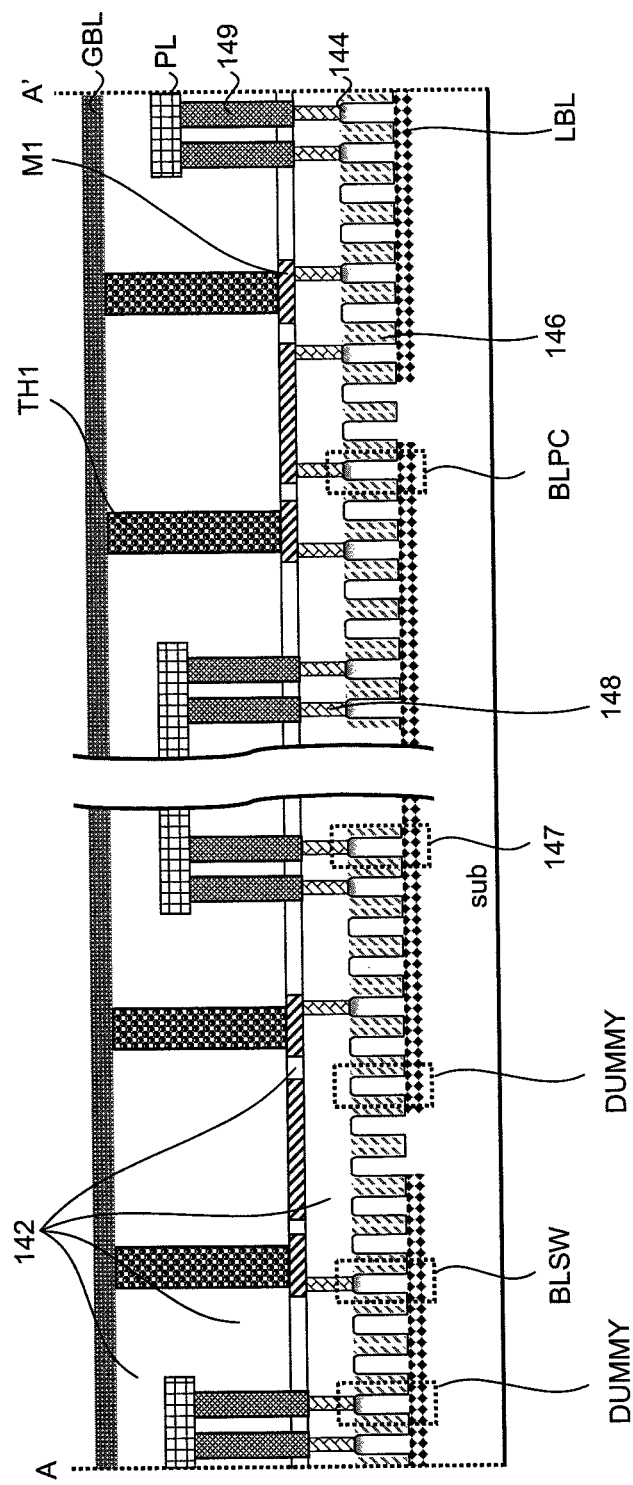
FIG. 17 is a sectional view take along a line A-A' of FIG. 16.

Referring to FIGS. 16 and 17, the description will be made about a semiconductor device according to a second embodiment of this invention.

FIG. 16 shows a layout of a memory cell block SMB included in the semiconductor device according to the second embodiment while FIG. 17 is a sectional view taking along a line A-A' of FIG. 16. In FIG. 16, similarly as for FIG. 13, global bit lines GBLs are omitted. The layout of FIG. 16 differs from that of FIG. 13 in that switch MOS transistors BLSWs are arranged in two rows and the switch MOS transistors BLSWs and dummy MOS transistors are alternately located along the word line direction. With this configuration, it is possible to delete extended parts of the M1 wiring lines which are extending from an upper side of the switch MOS transistor BLSW toward right or left. Namely, it is possible to make the M1 wiring line of FIG. 16 approximately square in shape though the M1 wiring line of FIG. 13 has an angulate racket shape. A row of dummy MOS transistors for locating contacts TH1s is located at each side of the two rows of the switch MOS transistors BLSWs. Thus, the layout size of the memory cell block SMB can be reduced by 4F and this allows inhibiting increase of the layout area of the semiconductor device in the future.

Next, referring to FIGS. 18 to 20, the description will be made about a semiconductor device according to a third embodiment of this invention.

Figure 18:
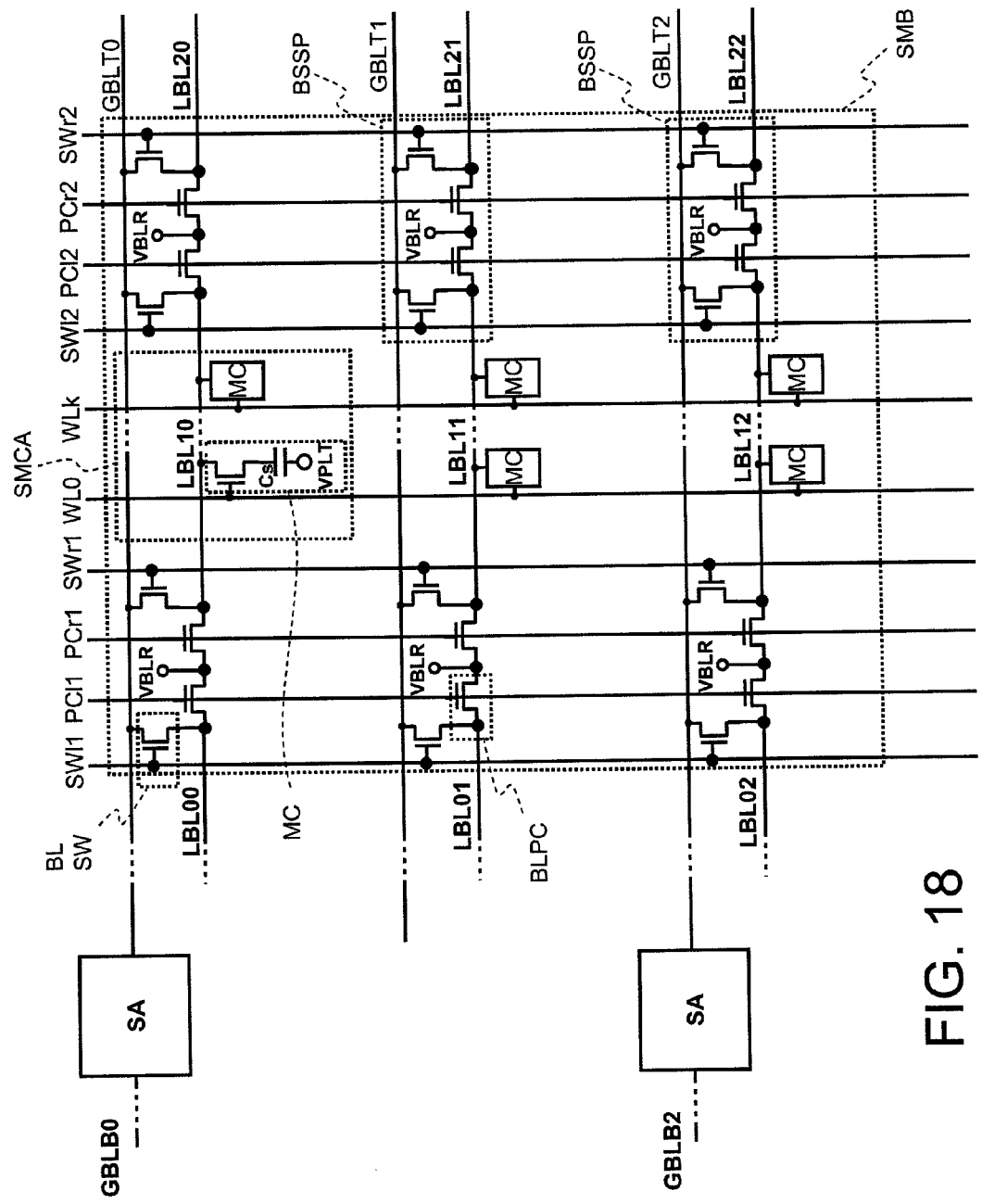
FIG. 18 is a configuration diagram of a sub-memory block (SMB) in a semiconductor device according to a third embodiment of this invention.

The semiconductor device of FIG. 18 is similar to the semiconductor device of FIG. 9 except that the bit line connection switch arrays BSSs are substituted with bit line connection switch arrays BSSPs which have pre-charge MOS transistors BLPCs. That is, in the semiconductor device according to the embodiment, both of a switch MOS transistor BLSW, which is connected to a global bit line, and a pre-charge MOS transistor BLPC are connected with each end of a local bit line.

With this configuration, pre-charge operation can be executed through the pre-charge MOS transistors provided at both ends of the local bit line. This allows speeding up the pre-charge operation in comparison with a case where the pre-charge MOS transistor BLPC is provided at either end of the local bit line. Accordingly, the configuration is particularly advantageous for a high resistance of the local bit line.

Figure 19:
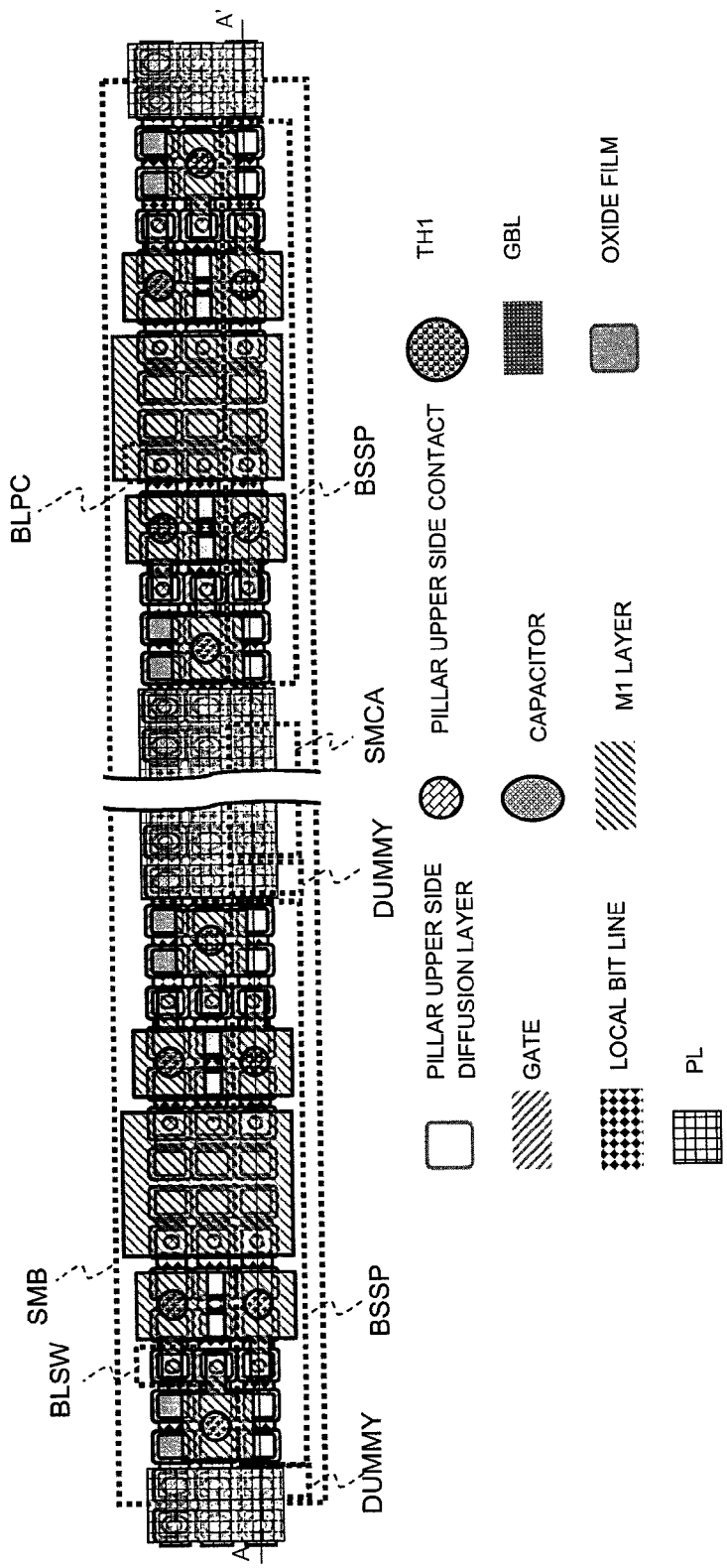
FIG. 19 is a layout chart showing an example of a layout of the sub-memory block (SMB) of FIG. 18.

FIG. 19 shows a layout of a sub-memory block SMB include in the semiconductor device of FIG. 18. FIG. 20 is a sectional view taking along a line A-A' of FIG. 19. In FIG. 19, global bit lines GBLs are omitted.

Figure 20:
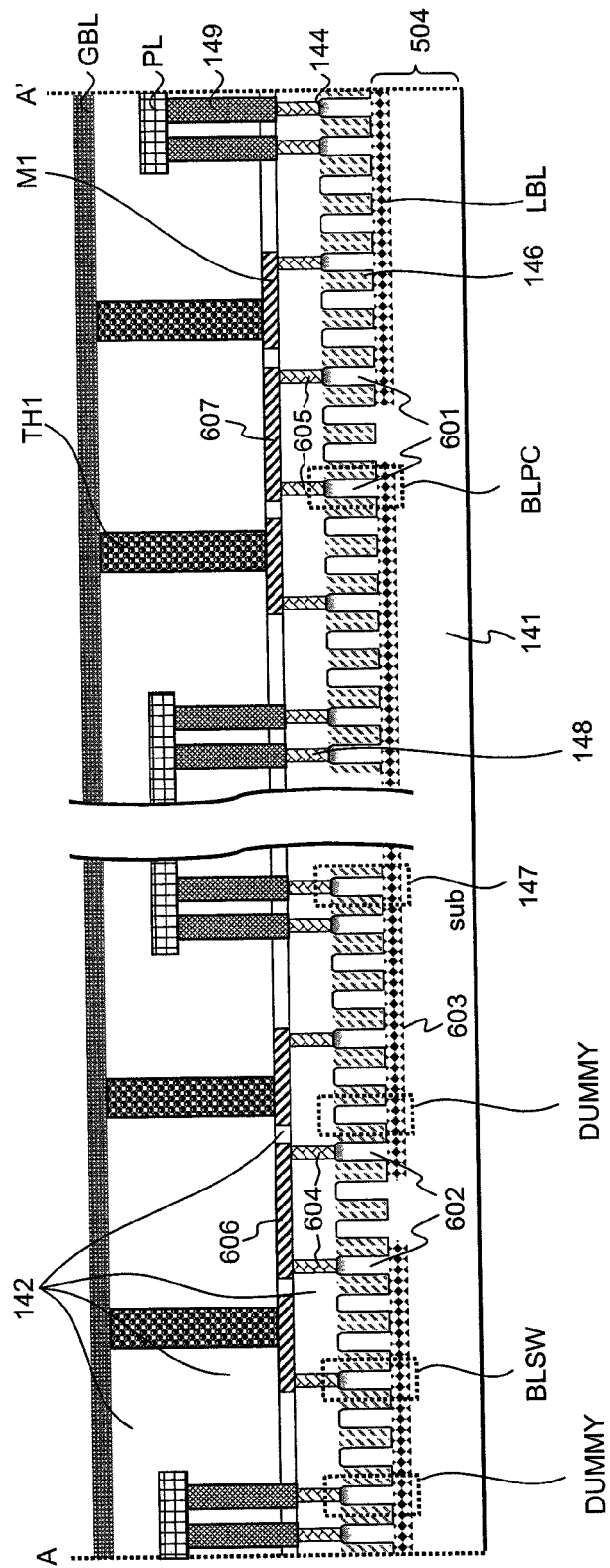
FIG. 20 is a sectional view take along a line A-A' of FIG. 19.

As understood from FIGS. 19 and 20, in the embodiment, the switch MOS transistor BLSW and the pre-charge MOS transistor are provided at each end of the local bit line. This configuration can be materialized by converting the dummy MOS transistor located between pre-charge MOS transistors arranged in the word line direction into a pre-charge MOS transistor. Consequently, as understood from the comparison between FIGS. 20 and 14, the layout area of the semiconductor device of the embodiment does not increase.

In the semiconductor device of the embodiment, the semiconductor substrate (141 in FIG. 20) possesses sixth and seventh parts (601 and 602 in FIG. 20). The sixth and the seventh parts include diffusion layers (144 in FIG. 20) at one ends of them. The other ends of the sixth and the seventh parts are connected to one and the other ends of a first local bit line (603 in FIG. 20) respectively. The semiconductor device possesses fifth and sixth upper side contacts (604 and 605 in FIG. 20) formed in the first insulating layer (142 in FIG. 20) and connected to the one ends of the sixth and the seventh parts respectively, and fifth and sixth wiring layers (606 and 607 in FIG. 20) formed in the first insulating layer and connected to the fifth and the sixth upper contacts respectively.

As mentioned above, according to the first to the third embodiments, it is possible to speed up the writing operation in a hierarchical bit line structure, which includes a global bit line and a local bit line, by providing a switch MOS transistor at each end of the local bit line. This is particularly advantageous for a high resistance of the local bit line.

Even if the length of the local bit line is twice as long as that of a related device, the hierarchical bit line structure of the embodiments allows speeding up the writing operation. In addition, the number of switch MOS transistors and the pre-charge MOS transistors can be reduced and thereby reducing the layout area.

When vertical MOS transistors are employed as memory cell transistors and switch MOS transistors in the hierarchical bit line structure, it is possible to suppress increase of the layout area by converting dummy MOS transistors into the switch MOS transistors.

By arranging the contacts TH1s, which couple the switch MOS transistors and M1 wiring lines with global bit lines, in staggered arrangement. It is possible to ensure necessary spaces between contacts TH1s and suppress increase of the layout area.

It is possible to speed up pre-charge operation by providing a pre-charge MOS transistor at each end of the local bit line in addition to providing the switch MOS transistor at each end of the local bit line.

While this invention has been described with reference to exemplary embodiments thereof, the invention is not limited to these embodiments. It will be understood by those of ordinary skill in the art that various changes in form and details may be made therein without departing from the spirit and scope of the invention as defined by the claims.

What is claimed is:

1. A device comprising:
    a semiconductor substrate;
    a first local bit line formed in the semiconductor substrate and elongated in a first direction;
    a first insulating layer formed on the semiconductor substrate;
    a first global bit line formed on the first insulating layer;
    a first path formed in the first insulating layer and configured to couple a first end of the first local bit line electrically with the first global bit line; and
    a second path formed in the first insulating layer and configured to couple a second end of the first local bit line electrically with the first global bit line, the first and second paths being coupled in parallel to each other between the global bit line and the first local bit line.

2. The device according to claim 1, wherein the semiconductor substrate includes first, second and third parts, and wherein:
    the first part includes the first local bit line;
    the second part is connected to the first end of the first local bit line at one end thereof, protrudes from the first part and includes a diffusion layer formed at the other end thereof to form a part of the first path; and
    the third part is connected to the second end of the first local bit line at one end thereof, protrudes from the first part and includes a diffusion layer formed at the other end thereof to form a part of the second path.

3. The device according to claim 2, further comprising:
    first and second through holes formed in the first insulating layer to be connected to the first global bit line;
    first and second upper side contacts formed in the first insulating layer to be connected to the one ends of the second and third parts respectively;
    a first wiring layer formed in the first insulating layer to couple the first through hole with the first upper side contact; and
    a second wiring layer formed in the first insulating layer to couple the second through hole with the second upper side contact, wherein
    the first path includes the first through hole, the first upper side contact and the first wiring layer while the second path includes the second through hole, the second upper side contact and the second wiring layer.

4. The device according to claim 1, further comprising:
    a plurality of second local bit lines formed in the semiconductor substrate, elongated in the first direction and arranged in parallel with the first local bit line in a second direction intersecting with the first direction;
    a plurality of second global bit lines formed on the first insulating layer to be arranged in parallel with the first global bit line in the second direction;
    a plurality of third paths formed in the first insulating layer to couple first ends of the second local bit lines with the second global bit lines, respectively; and
    a plurality of fourth paths formed in the first insulating layer to couple second ends of the second local bit lines with the second global bit lines, respectively.

5. The device according to claim 4, wherein
    the semiconductor substrate includes first, second, third, a plurality of fourth and a plurality of fifth parts, and wherein;
    the first part includes the first and the second local bit lines;
    the second part is connected to the first end of the first local bit line at one end thereof, protrudes from the first part and includes a diffusion layer formed at the other end thereof to form a part of the first path;

the third part is connected to the second end of the first local bit line at one end thereof, protrudes from the first part and includes a diffusion layer formed at the other end thereof to form a part of the second path;

each of the fourth parts is connected to the first end of an associated one of the second local bit lines at one end thereof, protrudes from the first part and includes a diffusion layer formed at the other end thereof to form a part of an associated one of the third paths; and each of the fifth parts is connected to the second end of an associated one of the second local bit lines at one end thereof, protrudes from the first part and includes diffusion layer formed at the other end thereof to form a part of an associated one of the fourth paths.

6. The device according to claim 5, wherein the second part and the fourth parts are formed on a first straight line extending in the second direction while the third part and the fifth parts are formed on a second straight line extending in the second direction and different from the first imaginary straight line.

7. The device according to claim 5, wherein the second part and the fourth parts are arranged in staggered arrangement in the second direction at a first region while the third part and the fifth parts are arranged in staggered arrangement in the second direction at a second region different from the first region.

8. The device according to claim 5, further comprising:
first and second through holes formed in the first insulating layer to be connected to the first global bit line;
first and second upper side contacts formed in the first insulating layer to be connected to the one ends of the second and third parts respectively;
a first wiring layer formed in the first insulating layer to couple the first through hole with the first upper side contact;
a second wiring layer formed in the first insulating layer to couple the second through hole with the second upper side contact;
a plurality of third and a plurality of fourth through holes formed in the first insulating layer to be connected to the second global bit lines respectively;
a plurality of third upper side contacts formed in the first insulating layer to be connected to the one ends of the fourth parts respectively;
a plurality of fourth upper side contacts formed in the first insulating layer to be connected to the one ends of the fifth parts respectively;
a plurality of third wiring layers formed in the first insulating layer to couple the third through holes with the third upper side contacts respectively; and
a plurality of fourth wiring layers formed in the first insulating layer to couple the fourth through holes with the fourth upper side contacts respectively, wherein:
the first path includes the first through hole, the first upper side contact and the first wiring layer while the second path includes the second through hole, the second upper side contact and the second wiring layer;
each of the third paths includes corresponding one of the third through holes, corresponding one of the third upper side contacts and corresponding one of the third wiring layers; and
each of the fourth paths includes corresponding one of the fourth through holes, corresponding one of the fourth upper side contacts and corresponding one of the fourth wiring layers.

9. The device according to claim 8, wherein the first through hole and the third through holes are arranged in first two rows in the second direction while the second through hole and the fourth through holes are arranged in second two rows that are different from the first two rows and are elongated in the second direction.

10. The device according to claim 3, wherein each of the second and the third parts serves as a switch.

11. The device according to claim 5, wherein each of the second, the third, the fourth and fifth parts serves as a switch.

12. The device according to claim 8, wherein the semiconductor substrate further includes a sixth part connected to the first or the second end of the first local bit line at one end thereof and protruding from the first part and including a diffusion layer formed at the other end thereof, and wherein the semiconductor device further comprises a fifth upper side contact formed in the first insulating layer and connected to the one end of the sixth part, and a fifth wiring layer formed in the first insulating layer and connected to the fifth upper side contact.

13. The device according to claim 8, wherein the semiconductor substrate further includes a sixth part connected to the first end of the first local bit line at one end thereof and protruding from the first part and including a diffusion layer formed at the other end thereof, and a seventh part connected to the second end of the first local bit line at one end thereof and protruding from the first part and including a diffusion layer formed at the other end thereof, and wherein the semiconductor device further comprises fifth and sixth upper side contacts formed in the first insulating layer and connected to the one ends of the sixth and the seventh parts respectively, and fifth and sixth wiring layers formed in the first insulating layer and connected to the fifth and the sixth upper side contacts respectively.

14. The device as claimed in claim 1, wherein the first path includes a first through hole formed in the first insulating layer, the second path includes a second through hole formed in the second insulating layer, the first global bit line includes first and second parts being located apart from each other, the first part of the global bit line is in contact with one end of the first through hole and the second part of the first global bit line is in contact with one end of the second through hole.

15. A device comprising:
a first global bit line elongated in a first direction;
a second global bit line arranged in a second direction intersecting with the first direction with respect to the first global bit line without any other global bit line therebetween and elongated in the first direction to be substantially parallel with the first global bit line;
a first local bit line elongated in the first direction;
a second local bit line arranged in the second direction with respect to the first local bit line without any other local bit line therebetween and elongated in the first direction to be substantially parallel with the first local bit line;
a first transistor electrically connected between one end of the first local bit line and the first global bit line and having a first conductivity type to be controlled with a first control signal;
a second transistor electrically connected between one end of the second local bit line and the second global bit line and having the first conductivity type to be controlled with the first control signal;
a third transistor electrically connected between the other another end of the first local bit line and the first global bit line in parallel to the first transistor and having the first conductivity type to be controlled with a second control signal; and a fourth transistor electrically connected between the other another end of the second local bit line and the second global bit line in parallel to the second transistor and having the first conductivity type to be controlled with the second control signal.

16. A device comprising:
a semiconductor substrate;
a diffusion layer formed in the semiconductor substrate and elongated in a first direction, the first diffusion layer serving as a local bit line;
a global bit line formed over the semiconductor substrate and elongated in the first direction;
a first transistor coupled between a first part of the diffusion layer and the global bit line; and
a second transistor coupled between a second part of the diffusion layer and the global bit line and coupled in parallel to the first transistor between the diffusion layer and the global bit line, the second part of the diffusion layer being located apart from the first part of the diffusion layer.

17. The device as claimed in claim 16, wherein the diffusion layer includes a third part disposed between the first and second part thereof, and the device further comprises a plurality of memory cells coupled to the third part of the diffusion layer.

18. The device as claimed in claim 17, further comprising a plurality of third transistors each coupled between an associated one of the memory cells and the diffusion layer.

19. The device as claimed in claim 18, wherein each of the third transistors is equal in conductivity type to the first and second transistors.

20. The device as claimed in claim 18, wherein each of the first, second and third transistors is of N-channel type.

21. The device as claimed in claim 16, wherein the first transistor comprises a first pillar, a first gate electrode formed on a side surface of the first pillar with an intervention of a first gate insulating film, a first upper diffusion region disposed near a top part of the first pillar, and a first lower diffusion region disposed near a bottom part of the first pillar, the first lower diffusion region being in contact with the first part of the diffusion layer, and the second transistor comprises a second pillar, a second gate electrode formed on a side surface of the second pillar with an intervention of a second gate insulating film, a second upper diffusion region disposed near a top part of the second pillar, and a second lower diffusion region disposed near a bottom part of the second pillar, the second lower diffusion region being in contact with the second part of the diffusion layer, the device further comprises,
a first conductive path connecting the first upper diffusion region of the first transistor to the global bit line; and
a second conductive path connecting the second upper diffusion region of the second transistor to the global bit line.

22. The device as claimed in claim 16, further comprising:
an insulating layer formed between the semiconductor substrate and the global bit line,
a first through hole formed in the insulating layer coupled to the first transistor at one end thereof, and
a second through hole formed in the insulating layer and coupled to the second transistor at one end thereof, and
wherein the global bit line includes third and fourth parts being located apart from each other, the third part of the global bit line is in contact with the other end of the first through hole and the fourth part of the global bit line is in contact with the other end of the second through hole.

23. The device as claimed in claim 16, wherein each of the first and second transistors is electrically coupled between the diffusion layer and the global bit line.

* * * * *